United States Patent
Wang et al.

(10) Patent No.: US 7,498,261 B2
(45) Date of Patent: Mar. 3, 2009

(54) METHOD AND APPARATUS FOR FORMING METAL FILM

(75) Inventors: Xinming Wang, Tokyo (JP); Daisuke Takagi, Tokyo (JP); Akihiko Tashiro, Tokyo (JP); Yukio Fukunaga, Tokyo (JP); Akira Fukunaga, Tokyo (JP); Akira Owatari, Tokyo (JP)

(73) Assignee: Ebara Corporation, Tokyo (JP)

( * ) Notice: Subject to any disclaimer, the term of this patent is extended or adjusted under 35 U.S.C. 154(b) by 449 days.

(21) Appl. No.: 11/219,777

(22) Filed: Sep. 7, 2005

(65) Prior Publication Data

US 2006/0057839 A1    Mar. 16, 2006

(30) Foreign Application Priority Data

Sep. 8, 2004    (JP) .............. 2004-260527

(51) Int. Cl.
*H01L 21/44* (2006.01)
(52) U.S. Cl. ............. 438/678; 438/653; 438/674; 257/E21.002
(58) Field of Classification Search ......... 438/678, 438/674, 653, 902
See application file for complete search history.

(56) References Cited

U.S. PATENT DOCUMENTS

| | | | |
|---|---|---|---|
| 5,695,810 A | 12/1997 | Dubin et al. | |
| 6,114,243 A | 9/2000 | Gupta et al. | |
| 6,323,554 B1 | 11/2001 | Joshi et al. | |
| 6,924,232 B2 * | 8/2005 | Mathew et al. | 438/678 |
| 7,060,619 B2 * | 6/2006 | Cowley et al. | 438/687 |

FOREIGN PATENT DOCUMENTS

| | | |
|---|---|---|
| JP | 4-183893 | 6/1992 |
| JP | 10-261635 | 9/1998 |
| JP | 2003-179000 | 6/2003 |
| JP | 2003-253488 | 9/2003 |
| JP | 2003-293193 | 10/2003 |

OTHER PUBLICATIONS

Takayuki Homma et al., "Preparation of Functionally Graded Magnetic Thin Films by Electroless Deposition Process", Department of Applied Chemistry, Waseda University, vol. 22, No. 6, pp. 350-356, 2001, partial English translation.
Takayuki Homma et al., "Preparation of Functionally Graded Magnetic Thin Films by Electroless Deposition Process", Department of Applied Chemistry, Waseda University, vol. 22, No. 6, pp. 350-356, 2001, partial English translation of parts framed on pp. 3, 4, 5 and 7.

* cited by examiner

*Primary Examiner*—Zandra Smith
*Assistant Examiner*—Christy L Novacek
(74) *Attorney, Agent, or Firm*—Wenderoth, Lind & Ponack, L.L.P.

(57) ABSTRACT

A metal film-forming method of the present invention can form a metal film having different film qualities in the thickness direction, in a continuous manner using a single processing solution. The metal film-forming method including: providing a substrate having embedded interconnects formed in interconnect recesses provided in a surface of the substrate; and forming a metal film, having different film qualities in the thickness direction, on surfaces of the interconnects in a continuous manner by changing the flow state of a processing solution relative to the surface of the substrate while keeping the surface of the substrate in contact with the processing solution.

6 Claims, 19 Drawing Sheets

METHOD AND APPARATUS FOR FORMING METAL FILM

BACKGROUND OF THE INVENTION

1. Field of the Invention

The present invention relates to a method and apparatus for forming a metal film, and more particularly to a method and apparatus for forming a metal film, which are useful for forming, for example, a metal film for covering exposed surfaces of embedded interconnects formed in a surface of a substrate, such as a semiconductor wafer, and protecting the interconnects, or a metal film for the formation of interconnects embedded in interconnect recesses provided in a surface of a substrate.

2. Description of the Related Art

In interconnect formation processes for semiconductor devices, a process is employed (so-called damascene process) in which metal (conductive material) is embedded in interconnect recesses, such as trenches and contact holes. This process includes embedding aluminum or, recently, metal, such as copper or silver in trenches and contact holes, which have previously been formed in an interlevel dielectric film, and then removing excessive metal by chemical-mechanical polishing (CMP) so as to flatten a surface of the substrate.

Conventionally, in such interconnects, for example, interconnects which use copper as an interconnect material, there has been employed a method in which a barrier layer is formed on the bottom surfaces and the side surfaces of the interconnects to prevent thermal diffusion of the interconnects (copper) into an interlevel dielectric film and to improve electromigration resistance of the interconnects so as to improve the reliability, or a method in which an anti-oxidizing film is formed to prevent oxidation of the interconnects (copper) under an oxidizing atmosphere so as to produce a semiconductor device having a multi-level interconnect structure in which insulating films (oxide films) are subsequently laminated. Generally, metal, such as tantalum, titanium, or tungsten, or nitride thereof has been used as this type of barrier layer. Nitride of silicon has generally been used as an anti-oxidizing film.

As an alternative of the above methods, a method has been studied in which bottom surfaces and side surfaces or exposed surfaces of embedded interconnects are selectively covered with an interconnects-protective film made of a cobalt alloy, a nickel alloy, or the like, to prevent thermal diffusion, electromigration, and oxidation of the interconnects. With regard to a non-volatile magnetic memory, it has been proposed that portions around memory interconnects are covered with a magnetic film such as a cobalt alloy or a nickel alloy to prevent a writing current from increasing due to miniaturization. For example, a cobalt alloy, a nickel alloy, and the like, are obtained by electroless plating.

FIGS. 1A through 1D illustrate, in a sequence of process steps, an example of forming copper interconnects in a semiconductor device. First, as shown in FIG. 1A, an insulating film (interlevel dielectric film) 2, such as an oxide film of $SiO_2$, or a film of low-k material, or the like, is deposited on a conductive layer 1a formed on a semiconductor base 1 having formed semiconductor devices. Contact holes 3 and trenches 4 are formed in the insulating film 2 by performing a lithography/etching technique so as to provide interconnect recesses. Thereafter, a barrier layer 5 of TaN or the like is formed on the insulating film 2, and a seed layer 6 as a feeding layer for electroplating is formed on the barrier layer 5 by sputtering, or the like.

Then, as shown in FIG. 1B, copper plating is performed on a surface of a substrate W to fill the contact holes 3 and the trenches 4 with copper and, at the same time, deposit a copper film 7 on the insulating film 2. Thereafter, the barrier layer 5, the seed layer 6 and the copper film 7 on the insulating film 2 are removed by chemical-mechanical polishing (CMP) or the like, so as to leave copper filled in the contact holes 3 and the trenches 4, and have a surface of the insulating film 2 lie substantially on the same plane as this copper. Interconnects (copper interconnects) 8 composed of the seed layer 6 and the copper film 7 are thus formed in the insulating film 2, as shown in FIG. 1C.

Then, as shown in FIG. 1D, electroless plating is performed on a surface of the substrate W to selectively form a interconnects-protective film (cap material) 9 of, for example, a CoWP alloy on surfaces of interconnects 8, thereby covering and protecting the surfaces of interconnects 8 with the interconnects-protective film 9.

Herein described is a process of forming a interconnects-protective film (cap material) 9 of such a CoWP alloy film selectively on surfaces of interconnects 8 by using a conventional electroless plating method. First, the substrate W such as a semiconductor wafer, which has been carried out a CMP process, is immersed, for example, in dilute sulfuric acid having an ordinary temperature for about one minute to remove CMP residues, such as copper remaining on a surface of an insulating film 2, a metal oxide film on interconnects, and the like. After the surface of the substrate W is cleaned with a cleaning liquid such as pure water, the substrate W is immersed, for example, in a $PdSO_4/H_2SO_4$ mixed solution or $PdCl_2/HCl$ mixed solution having an ordinary temperature for about one minute to adhere Pd as a catalyst to the surfaces of the interconnects 8 so as to activate exposed surfaces of the interconnects 8.

After the surface of the substrate W is cleaned (rinsed) with pure water or the like, the substrate W is immersed, for example, in a CoWP plating solution at the solution temperature of 80° C. for about 120 seconds to carry out electroless plating selectively on surfaces of the activated interconnects 8. Thereafter, the surface of the substrate W is cleaned with a cleaning liquid, such as pure water, and dried. Thus, an interconnects-protective film 9 made of a CoWP alloy is formed selectively on the exposed surfaces of interconnects 8, so as to protect interconnects 8.

Informing an interconnects-protective film (metal film) 9 of a W-containing alloy, such as CoWP or CoWB, selectively on the surfaces of interconnects 8 by electroless plating in the manner as described above, for example, the metal film is little affected by the surface morphology of the base metal (interconnects) when the W content of the metal film (alloy) is low (e.g. not more than 2 wt %). Thus, the metal film has suitable (i.e., little) surface roughness. On the other hand, the deposition reaction is relatively fast and the rate of deposition of the metal film tends to be supply-controlled. Accordingly, the metal film tends to be highly pattern-dependent, that is, a thickness of the metal film may vary considerably over the entire substrate surface depending upon the interconnect width and the density of interconnects in the substrate surface.

In contrast, when the W content of the metal film (alloy) is high (e.g. not less than 2 wt %), the deposition reaction is relatively slow because of the high W content of the plating bath, and the rate of deposition of the metal film tends to be kinetically controlled. Accordingly, the thickness of the metal film over the entire substrate surface is less dependent upon the interconnect width and the density of interconnects in the substrate surface. On the other hand, the metal film is likely to be affected by the surface morphology of the base metal (interconnects). Thus, the metal film has considerable surface roughness and non-uniform thickness.

In view of the above, a two-step plating method is proposed which comprises a first-step plating using a first plating bath containing a small amount of W or not containing W, and a second-step plating using a plating bath containing a large amount of W or containing W. The two-step plating method, however, involves the problems that it necessitates a larger-sized plating apparatus with an increased footprint, and that it is difficult to control the surface conditions of the metal film (plated film) during the interval between the two steps.

SUMMARY OF THE INVENTION

The present invention has been made in view of the above situation in the related art. It is therefore an object of the present invention to provide a method and apparatus for forming a metal film having different film qualities in the thickness direction, in a continuous manner using a single processing solution.

To achieve the above object, the present invention provides a method for forming a metal film comprising: providing a substrate having embedded interconnects formed in interconnect recesses provided in a surface of the substrate; and forming a metal film, having different film qualities in the thickness direction, on surfaces of the interconnects in a continuous manner by changing the flow state of a processing solution relative to the surface of the substrate while keeping the surface of the substrate in contact with the processing solution.

According to the present invention, a metal film, having different film qualities in the thickness direction, can be formed in a continuous manner using a single processing solution, without resorting to two-step plating using plating solutions having different compositions.

The flow state of the processing solution relative to the surface of the substrate can be changed by increasing or decreasing the flow velocity of the processing solution relative to the substrate surface during the formation of the metal film.

In the formation of a metal film of a Co alloy containing W, such as CoWP or CoWB, by electroless plating, the concentration of the W component in an electroless plating bath is generally especially low as compared to the other components. Accordingly, when changing the film quality of the metal film being formed by changing the flow state of the processing solution in the vicinity of the surface of the substrate, the supply of W is considered to most affect the film quality of the metal film. Thus, by increasing the flow velocity of the processing solution in the vicinity of the surface of the substrate during the formation of the metal film to increase the concentration of the W component in the processing solution present in the vicinity of the substrate surface and to thereby make the W content of the metal film formed in the later stage of plating larger than the W content of the metal film formed in the early stage of plating, it becomes possible to improve both the surface roughness and the pattern dependency of the metal film.

The present invention provides another method for forming a metal film comprising: providing a substrate having interconnect recesses formed in a surface of the substrate; and forming a metal film, having different film qualities in the thickness direction, on the surface of the substrate in a continuous manner by changing the flow state of a processing solution relative to the surface of the substrate while keeping the surface of the substrate in contact with the processing solution, thereby filling the recesses with the metal film.

When forming a metal film composed of a single metal, e.g. copper, to fill interconnect recesses with the metal film (copper), the metal film, having different properties (film qualities), such as orientation of copper and resistivity, in the thickness direction, can be formed in a continuous manner by changing the flow state of a processing solution in the vicinity of the surface of the substrate to thereby adjust the content of an additive in the metal film being formed.

The flow state of the processing solution relative to the surface of the substrate may be changed by changing the rotational speed of the substrate.

The flow speed of the processing solution relative to the substrate in the vicinity of the surface of the substrate can be increases by increasing the rotational speed of the substrate. Thus, when forming a metal film of a W-containing Co alloy by electroless plating, the W concentration of a plating solution present in the vicinity of the substrate surface can be increased by increasing the rotational speed of the substrate.

The flow state of the processing solution relative to the surface of the substrate may also be changed by changing the flow velocity of the processing solution in a processing tank.

For example, the flow state of the processing solution in the vicinity of the substrate surface can be changed during the film formation by changing the circulation amount of processing solution when the processing solution is circulating in a circulation system including the processing tank, or by changing the flow velocity of circulating processing solution when the processing solution is circulating within the processing tank, or by changing the intensity of agitation when the processing solution in the processing tank is under agitation.

When providing a substrate having embedded interconnects, comprised of a plurality of interconnect layers, formed in a surface, and forming a metal film, having different film qualities in the thickness direction, on surfaces of interconnects in a continuous manner by changing the flow state of a processing solution in the vicinity of the surface of the substrate while keeping the substrate surface in contact with the processing solution, it is possible to determine the number of the interconnect layers and change the flow state in the vicinity of the substrate surface or the manner of changing the flow state according to the number of the interconnect layers. The pattern of interconnects may vary each layer of multi-level interconnects, and specifications required for interconnects or an interconnects-protective film may be different for each interconnect layer. By changing the flow state in the vicinity of the substrate surface or the manner of changing the flow state for the respective interconnect layers, it becomes possible to obtain the best metal film under the optimum processing conditions.

The present invention provides an apparatus for forming a metal film, comprising: a substrate holder for holding a substrate; a processing tank for holding a processing solution for contact with a surface of the substrate held by the substrate holder; and a drive control system for changing the flow state of the processing solution relative to the substrate in the vicinity of the surface of the substrate held by the substrate holder and kept in contact with the processing solution in the processing tank.

In a preferred aspect of the present invention, the drive control system includes a rotating device for rotating the substrate holder, and a control section for controlling the rotational speed of the rotating device.

Preferably, the drive control system includes a liquid-flowing device for creating a flow of the processing solution in the processing tank, and a control section for controlling a drive section of the liquid-flowing device.

The present invention provides still another method for forming embedded interconnects comprised of a plurality of interconnect layers on a substrate, comprising the steps of: providing a substrate having a first interconnect layer formed in a surface of the substrate, and forming an interconnects-protective film on the surface of the first interconnect layer by bringing the surface of the first interconnect layer into contact with a processing solution; and forming a second interconnect layer on the surface of the substrate, and forming an interconnects-protective film on the surface of the second interconnect layer by bringing the surface of the second interconnect layer into contact with a processing solution; wherein the flow state of the processing solution relative to the surface of the interconnect layer or a manner of changing the flow state differs between the step of forming the interconnects-protective film on the surface of the first interconnect layer and the step of forming the interconnects-protective film on the surface of the second interconnect layer.

The processing solution for use in the step of forming the interconnects-protective film on the surface of the first interconnect layer may have the same composition as the processing solution for use in the step of forming the interconnects-protective film on the surface of the second interconnect layer.

DETAILED DESCRIPTION OF THE INVENTION

Embodiments of the present invention will now be described with reference to the drawings. The following description illustrates employing, as a film-forming apparatus, an electroless plating apparatus which uses a plating solution as a processing solution, and forming an interconnects-protective film (cap material) 9 which selectively covers exposed surfaces of interconnects 8 as a base metal to protect the interconnects 8, as shown in FIG. 1D. The interconnects-protective film 9 may be a metal film of a CoWP alloy.

Figure 1C:
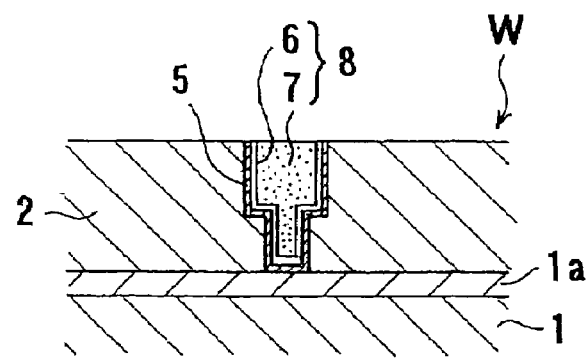
Figure 2:
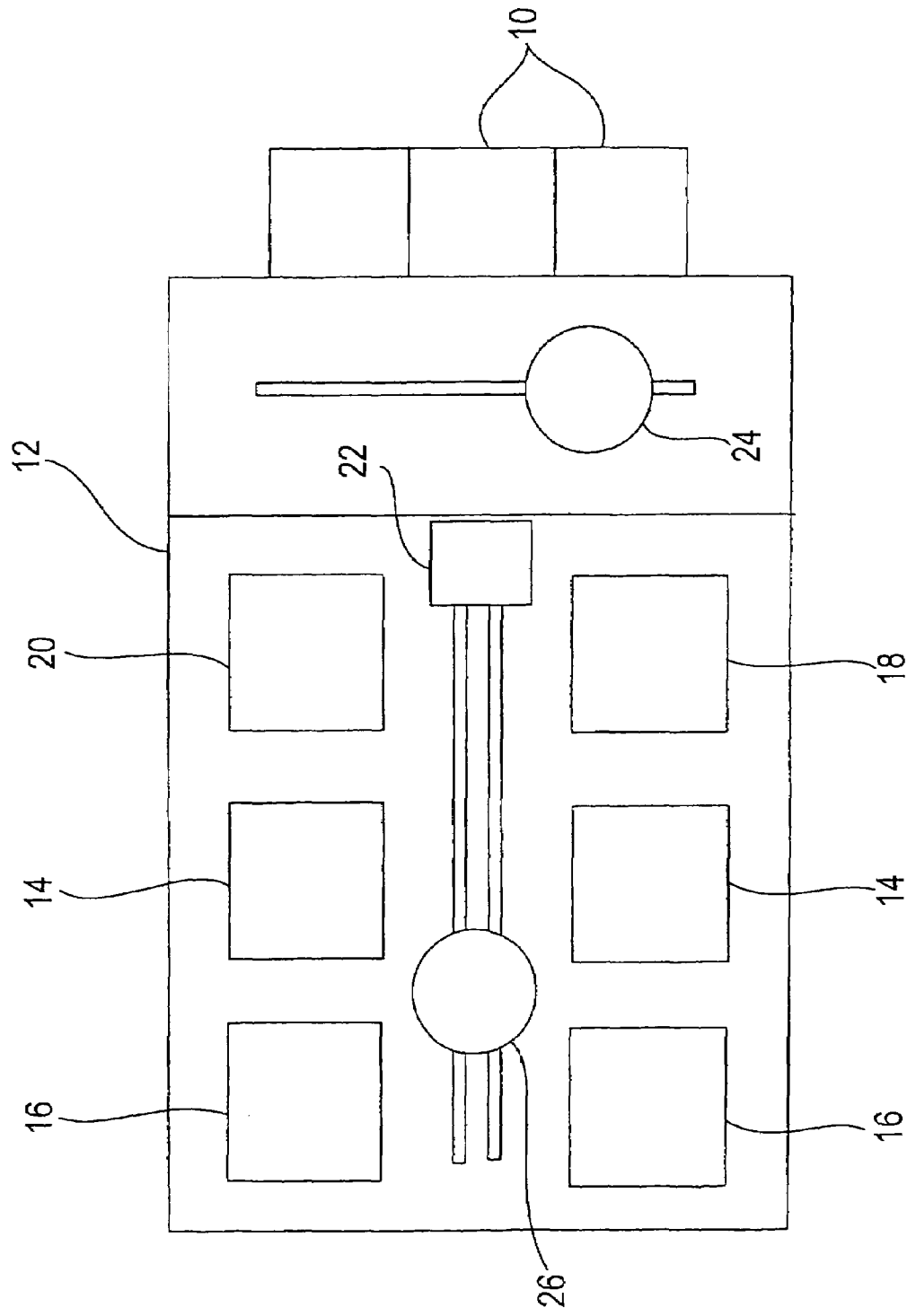
FIG. 2 is a layout plan view of a substrate processing apparatus incorporating a film-forming apparatus (electroless plating apparatus) according to an embodiment of the present invention.

FIG. 2 is a layout plan view of a substrate processing apparatus incorporating an electroless plating apparatus (film-forming apparatus) according to an embodiment of the present invention. As shown in FIG. 2, the substrate processing apparatus is provided with loading/unloading units 10 each for mounting substrate cassette which accommodate a number of substrates W, such as semiconductor devices, having interconnects (base metal) 8 of e.g. copper on the surfaces, as shown in FIG. 1C. Inside of a rectangular apparatus frame 12 having an air discharge system, there are disposed two cleaning/catalyst applying apparatuses 14 each combining a cleaning apparatus for cleaning a surface of a substrate (post-CMP cleaning or pre-plating cleaning) and a catalyst applying apparatus for applying a catalyst, such as Pd, to a cleaned surface of the substrate.

Inside of the apparatus frame 12, there are disposed two electroless plating apparatuses 16 for performing electroless plating onto a surface (processing surface) of the substrate W, a post-plating processing apparatus 18 for performing post-plating of the substrate W after the plating to improve the selectivity of an interconnects-protective film (metal film) 9 (see FIG. 1D) formed on surfaces of interconnects 8 by electroless plating, a drying apparatus 20 for drying the substrate W after the post-processing, and a temporary storage table 22. Furthermore, inside of the apparatus frame 12, there are disposed a movable first substrate transport robot 24 for transferring a substrate between the temporary storage table 22 and the substrate cassette set in the loading/unloading station 14, and a moveable second substrate transport robot 26 for transporting a substrate between the temporary storage table 22 and each of the apparatuses 14, 16, 18, and 20.

Next, described below are details of various apparatuses provided in the substrate processing apparatus shown in FIG. 2.

The cleaning/catalyst applying apparatus 14 employs a two-liquid separation system to prevent the different liquids from being mixed with each other. While a peripheral portion of a lower surface of the substrate W, which is a surface to be processed (front face), transferred in a face-down manner is sealed, the substrate W can be fixed by pressing a rear face of the substrate.

As shown in FIGS. 3 through 6, the cleaning/catalyst applying apparatus 14 includes a fixed frame 52 that is mounted on the upper part of a frame 50, and a movable frame 54 that moves up and down relative to the fixed frame 52. A processing head 60, which includes a bottomed cylindrical housing portion 56, opening downwardly, and a substrate holder 58, may be suspended from and supported by the movable frame 54. In particular, a head-rotating servomotor 62 can be mounted to the movable frame 54, and the housing portion 56 of the processing head 60 can be coupled to the lower end of the downward-extending output shaft (hollow shaft) 64 of the servomotor 62.

Figure 6:
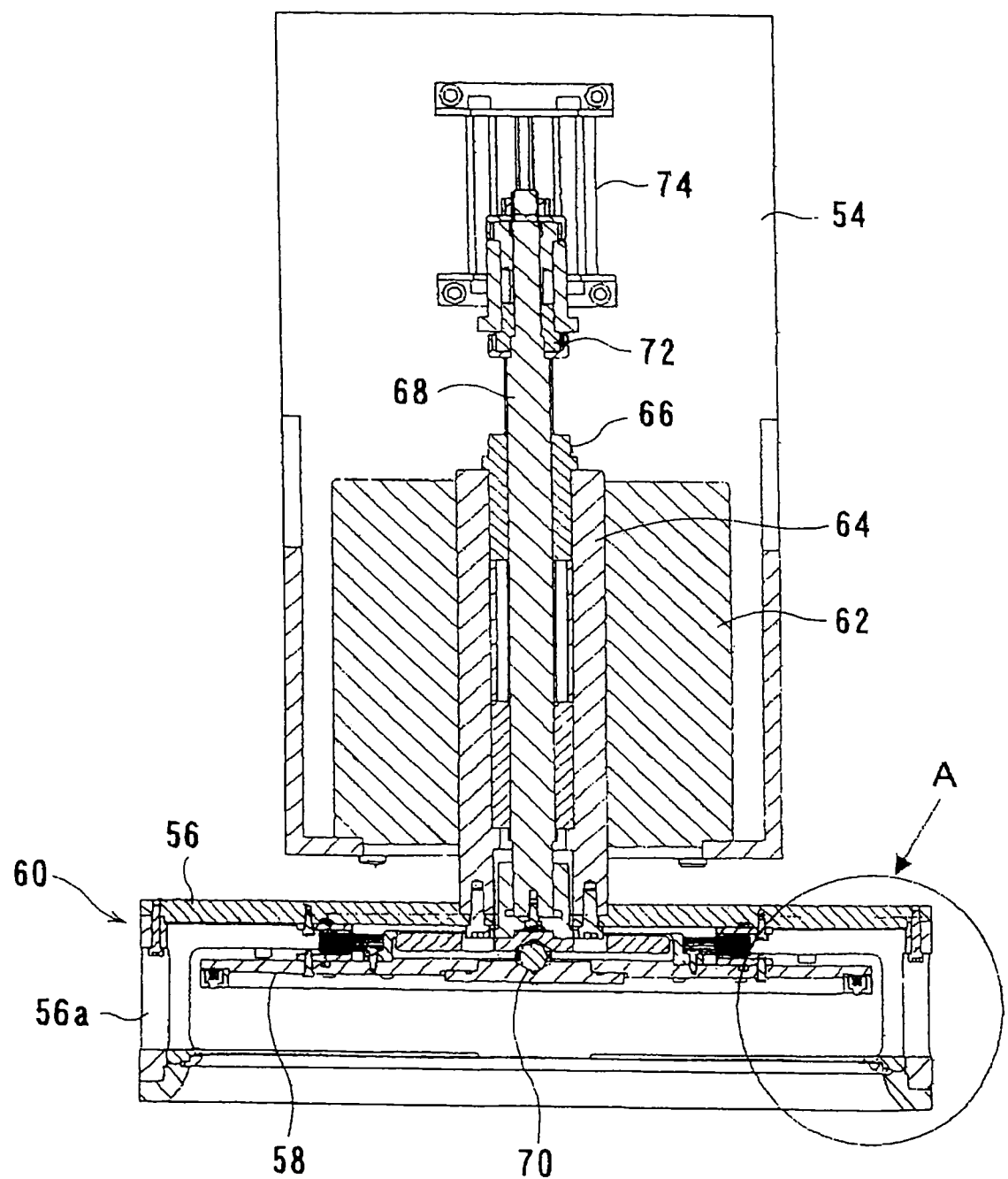
FIG. 6 is a cross-sectional view of a processing head of the cleaning/catalyst application apparatus, at a time of transferring a substrate.

As shown in FIG. 6, a vertical shaft 68, which rotates together with the output shaft 64 via a spline 66, can be inserted in the output shaft 64, and the substrate holder 58 of the processing head 60 may be coupled to the lower end of the vertical shaft 68 via a ball joint 70. The substrate holder 58 is positioned within the housing portion 56. The upper end of the vertical shaft 68 can be coupled via a bearing 72 and a bracket to a fixed ring-elevating cylinder 74 secured to the movable frame 54. Thus, by the actuation of the cylinder 74, the vertical shaft 68 enables vertical movement independently of the output shaft 64.

Linear guides 76, which extend vertically and guide vertical movement of the movable frame 54, are mounted to the fixed frame 52, so that by the actuation of a head-elevating cylinder (not shown), the movable frame 54 may move vertically by the guide of the linear guides 76.

Figure 7:
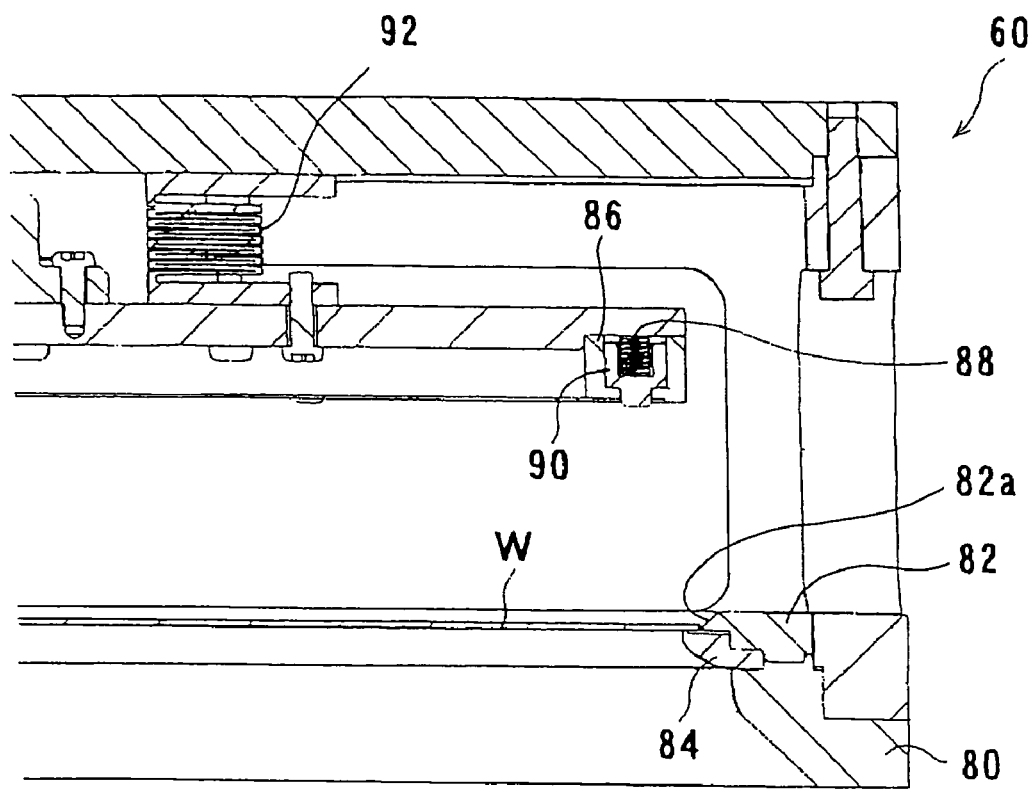
FIG. 7 is an enlarged view of the portion A of FIG. 6.
Figure 8:
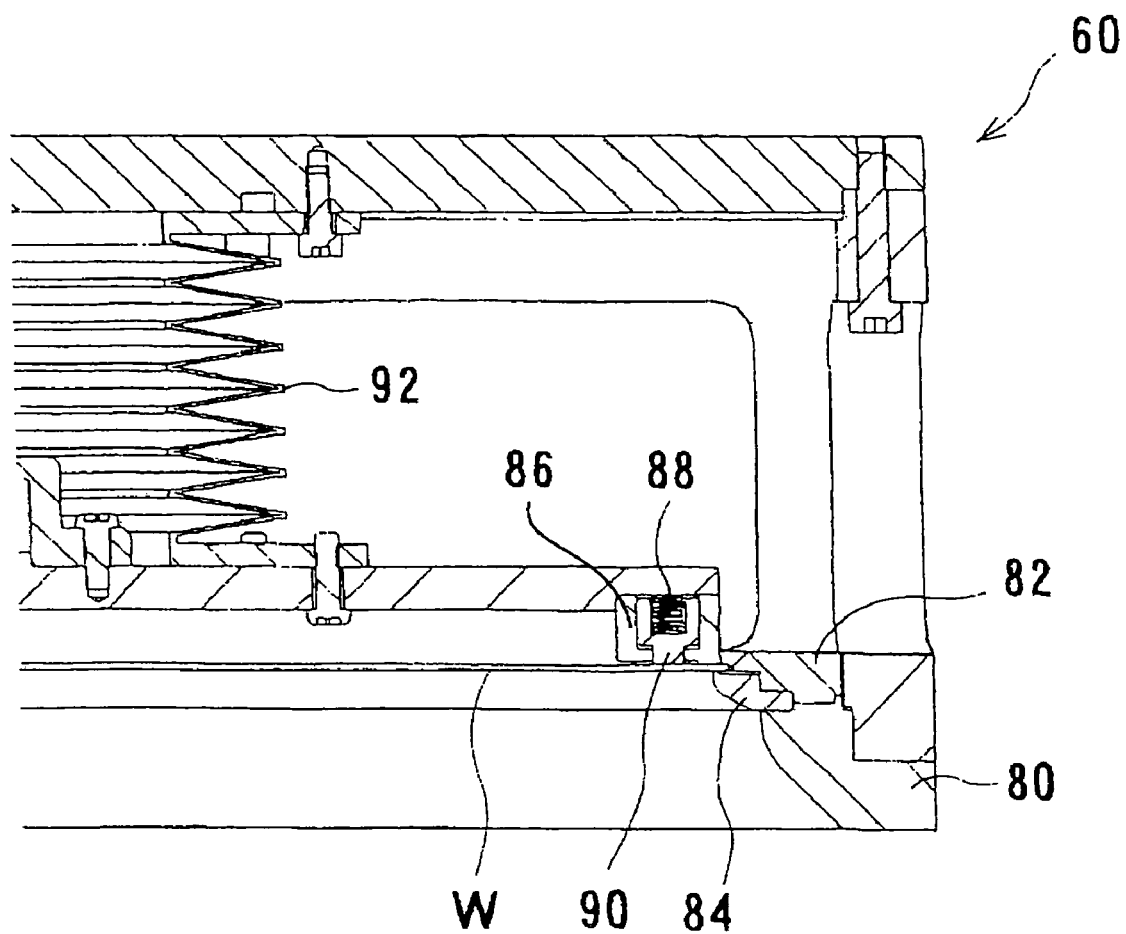
FIG. 8 is a view corresponding to FIG. 7, showing the processing head of the cleaning/catalyst application apparatus, at a time of fixing a substrate.

Substrate insertion windows 56a for inserting the substrate W into the housing portion 56 are formed in the circumferential wall of the housing portion 56 of the processing head 60. Further, as shown in FIGS. 7 and 8, a seal ring 84 may be provided in the lower portion of the housing portion 56 of the processing head 60, an outer peripheral portion of the seal ring 84 being sandwiched between a main frame 80 made of e.g. PEEK and a guide frame 82 made of e.g. polyethylene. The seal ring 84 is provided to enable contact with a peripheral portion of the lower surface of the substrate W to seal the peripheral portion.

On the other hand, a substrate fixing ring 86 may be fixed to a peripheral portion of the lower surface of the substrate holder 58. Columnar pushers 90, each protrude downwardly from the lower surface of the substrate fixing ring 86 by the elastic force of a spring 88 disposed within the substrate fixing ring 86 of the substrate holder 58. Further, a flexible cylindrical bellows-like plate 92 made of (e.g. TEFLON (registered trademark)) may be disposed between the upper surface of the substrate holder 58 and the upper wall of the housing portion 56 to hermetically seal therein.

When the substrate holder 58 is in a raised position, substrate w can be inserted from the substrate insertion window 56a into the housing portion 56. The substrate W is then guided by a tapered surface 82a provided in the inner circumferential surface of the guide frame 82, and positioned and placed at a predetermined position on the upper surface of the seal ring 84. In this state, the substrate holder 58 is lowered so as to bring the pushers 90 of the substrate fixing ring 86 into contact with the upper surface of the substrate W. The substrate holder 58 may be further lowered so as to press the substrate W downwardly by the elastic forces of the springs 88, thereby forcing the seal ring 84 to make pressure contact with a peripheral portion of the front surface (lower surface) of the substrate W to seal the peripheral portion while nipping the substrate W between the housing portion 56 and the substrate holder 58 to hold the substrate W.

When the head-rotating servomotor 62 is driven while the substrate W is being held by the substrate holder 58, the output shaft 64 and the vertical shaft 68 inserted in the output shaft 64 rotate together via the spline 66, whereby the substrate holder 58 rotates together with the housing portion 56.

At a position below the processing head 60, there is provided an upward-open processing tank 100 (see FIG. 9) comprising an outer tank 100a and an inner tank 100b which have a slightly larger inner diameter than the outer diameter of the processing head 60. A pair of leg portions 104, which is mounted to a lid 102, is rotatably supported on the outer circumferential portion of the inner tank 100b. Further, a crank 106 may be integrally coupled to each leg portion 106, and the free end of the crank 106 may be rotatably coupled to the rod 110 of a lid-moving cylinder 108. Thus, by the actuation of the lid-moving cylinder 108, the lid 102 can be moved between a processing position at which the lid 102 covers the top opening of the inner tank 100b and a retreat position beside the inner tank 100b. In the surface (upper surface) of the lid 102, there is provided a nozzle plate 112 having a large number of ejection nozzles 112a for ejecting e.g. pure water outwardly (upwardly).

Figure 9:
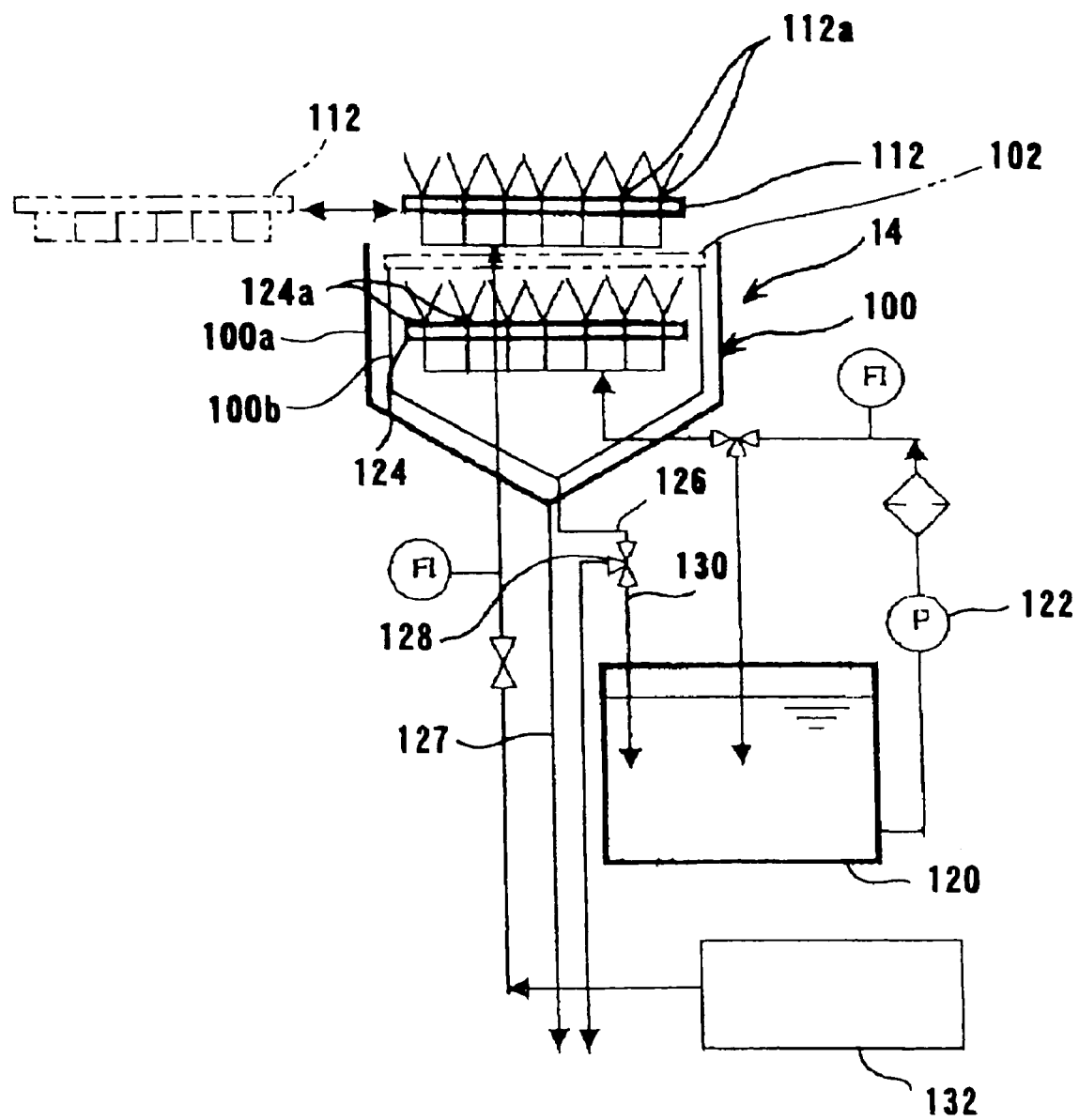
FIG. 9 is a systematic diagram of the cleaning/catalyst application apparatus.

Further, as shown in FIG. 9, a nozzle plate 124 having a plurality of ejection nozzles 124a for ejecting upwardly a chemical liquid, i.e. cleaning liquid or processing solution (catalyst processing solution), supplied from a chemical liquid tank 120 by driving the chemical liquid pump 122 is provided in the inner tank 100b of the processing tank 100 in such a manner that the ejection nozzles 124a are equally distributed over the entire surface of the cross section of the inner tank 100b. A drainpipe 126 for draining a chemical liquid (waste liquid) to the outside is connected to the bottom of the inner tank 100b. A three-way valve 128 is provided in the drainpipe 126 and the chemical liquid (waste liquid) is returned to the chemical liquid tank 120 through a return pipe 130 connected to one of outlet ports of the three-way valve 128 so as to reuse the chemical liquid, as needed.

Though one chemical liquid tank 120 is only shown diagrammatically, two chemical liquid tanks, i.e. a first chemical liquid tank for holding above-described cleaning liquid and a second chemical liquid tank for holding above-described processing solution (catalyst processing solution), may be provided. The cleaning liquid or the processing solution is selectively supplied to the ejection nozzles 124a from one of the first chemical liquid tank and the second chemical liquid tank and is ejected.

Further, in this embodiment, the nozzle plate 112 provided on the front face (upper surface) of the lid 102 can be connected to a rinsing liquid supply source 132 for supplying a rinsing liquid such as pure water. Furthermore, a drainpipe 127 is connected to a bottom surface of the outer tank 100a.

By lowering the processing head 60 holding the substrate, so as to cover the top opening portion of the inner tank 100b with the processing head 60 and then ejecting a chemical liquid, i.e. cleaning liquid during cleaning process or processing solution (catalyst processing solution) during catalyst applying process, from the ejection nozzles 124a of the nozzle plate 124 disposed in the inner tank 100b of the processing tank 100 toward the substrate W, the chemical liquid can be ejected uniformly onto the entire lower surface (surface to be processed) of the substrate W and discharged through the drainpipe 126 to the outside, while preventing the chemical liquid from being scattered to the outside.

Further, by lifting up the processing head 60, closing the top opening portion of the inner tank 100b with the lid 102, and then ejecting a rinsing liquid from the ejection nozzles 112a of the nozzle plate 112 disposed on the upper surface of the lid 102 toward the substrate W held by the processing head 60, a rinsing process (cleaning process) for a chemical liquid remaining on the surface of the substrate is performed. Since the rinsing liquid passes through a clearance between the outer tank 100a and the inner tank 100b and is discharged through the drainpipe 127, the rinsing liquid is prevented from flowing into the inner tank 100b and from being mixed with the chemical liquid.

Figure 3:
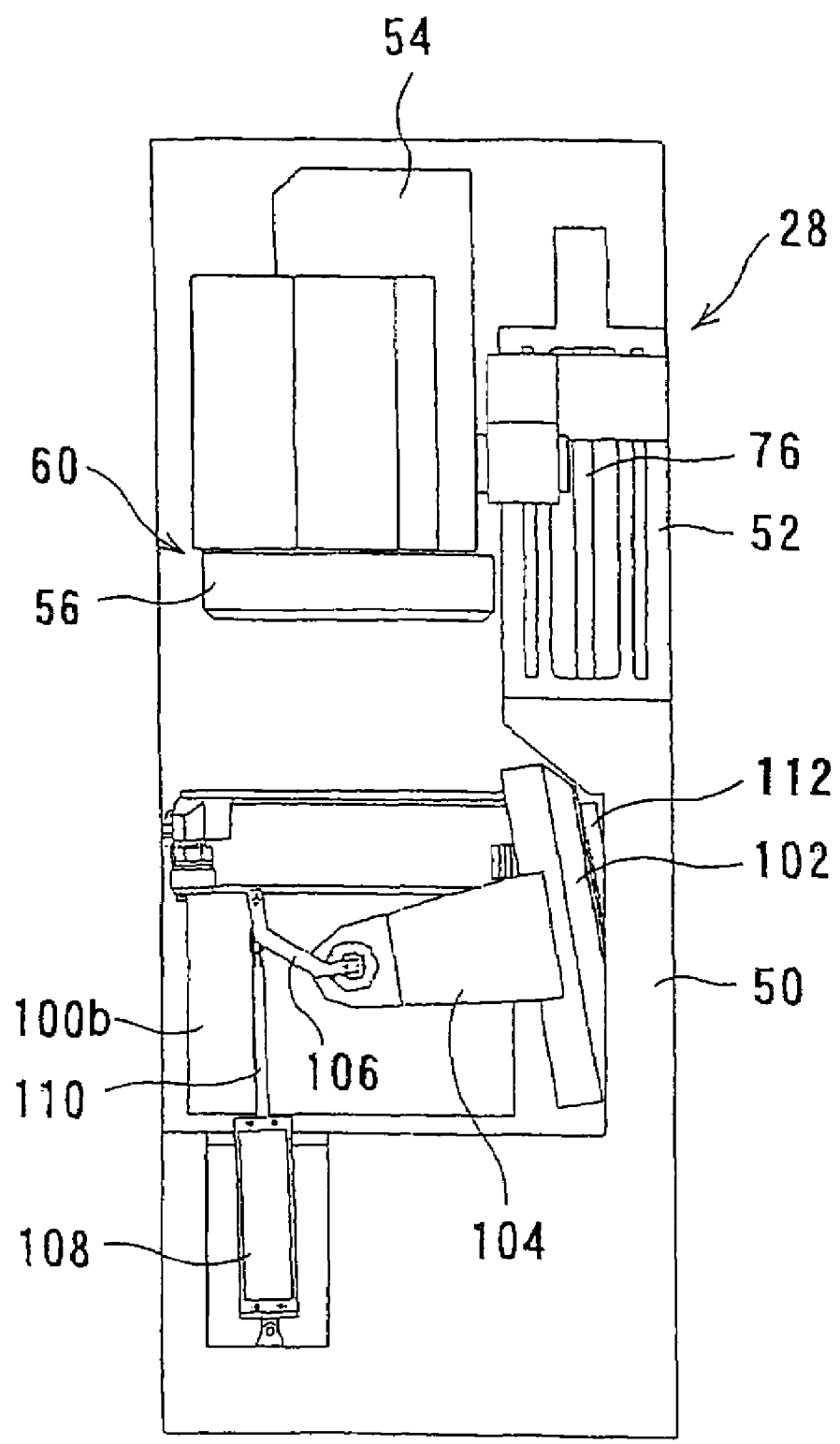
FIG. 3 is a front view of a cleaning/catalyst application apparatus, with depiction of an outer tank omitted, at a time of transferring a substrate.
Figure 4:
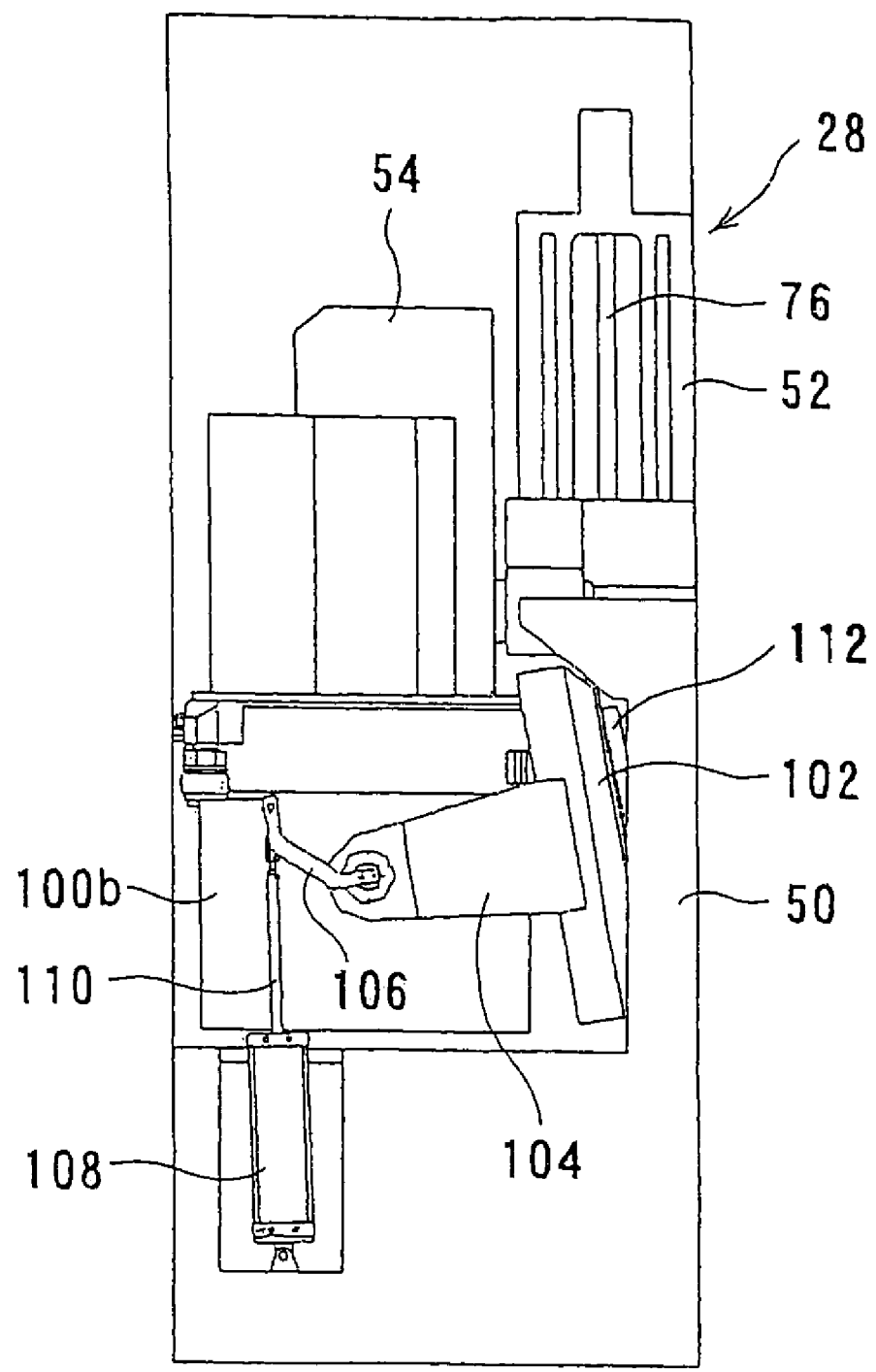
FIG. 4 is a front view of the cleaning/catalyst application apparatus, with depiction of an outer tank omitted, at a time of performing a chemical process.
Figure 5:
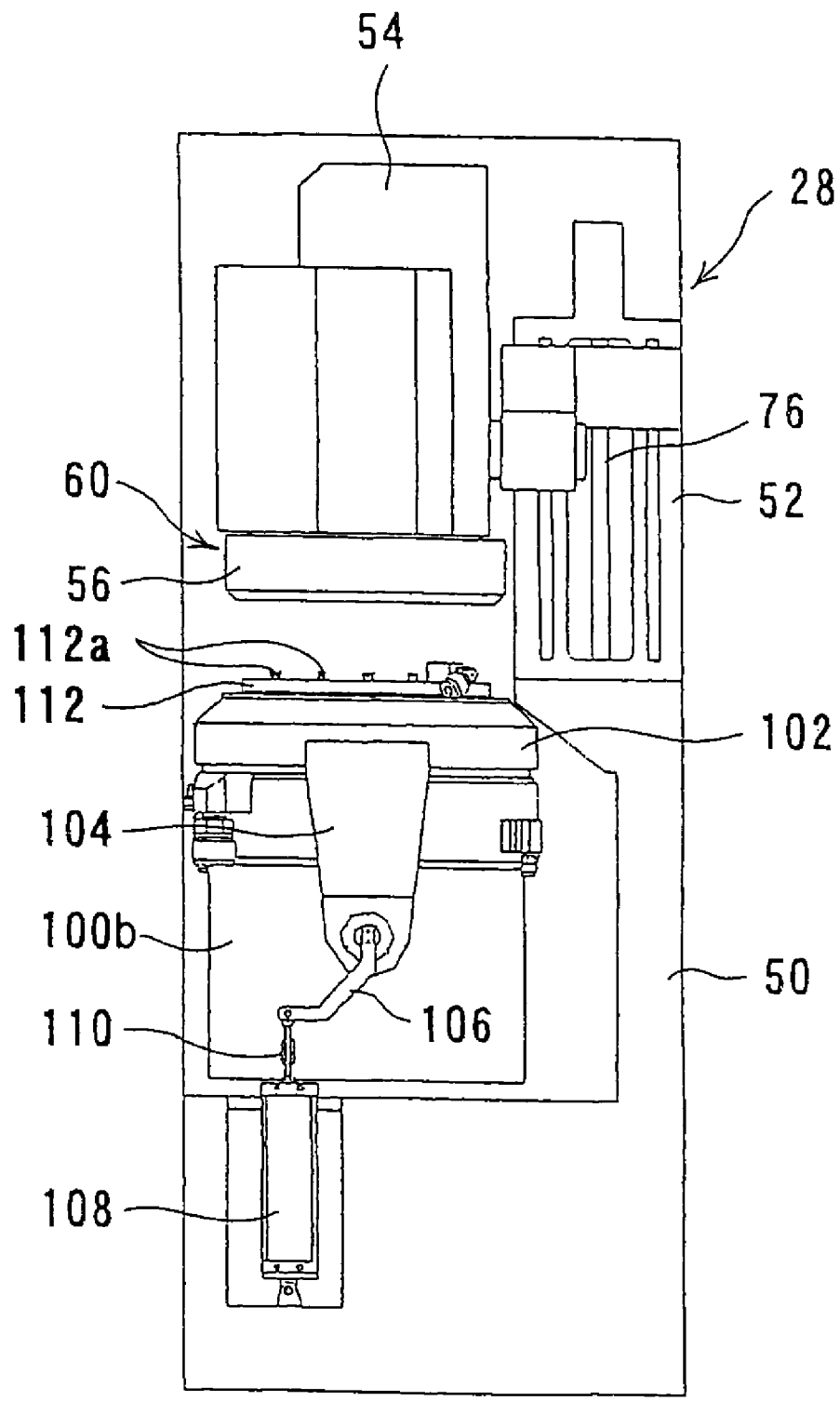
FIG. 5 is a front view of the cleaning/catalyst application apparatus, with depiction of an outer tank omitted, at a time of rinsing.

According to the cleaning/catalyst applying apparatuses 14, the substrate W can be inserted into and held by the processing head 60 when the processing head 60 is in the lifted position, as shown in FIG. 3. Thereafter, as shown in FIG. 4, the processing head 60 can be lowered to a position at which the processing head 60 covers the top opening portion of the inner tank 100b. While rotating the processing head 60 and thereby rotating the substrate W held by the processing head 60, a chemical liquid, i.e. cleaning liquid during cleaning process or processing solution (catalyst processing solution) during catalyst applying process, may be ejected from the ejection nozzles 124a of the nozzle plate 124 disposed in the inner tank 100b toward the substrate W to thereby eject the chemical liquid uniformly onto the entire surface of the substrate W. The processing head 60 is lifted up and stopped at a predetermined position. As shown in FIG. 5, the lid 102 in the retracting position is moved to a position at which the lid 102 covers the top opening portion of the inner tank 100b. Then, a rinsing liquid is ejected from the ejection nozzles 112a of the nozzle plate 112 disposed on the upper surface of the lid 102 toward the rotating substrate W held by the processing head 60. Thus, a process of the substrate W with a chemical liquid and a rinsing process of the substrate W with a rinsing liquid can be performed without mixing these two liquids.

FIGS. 10 through 14 show an embodiment of the electroless plating apparatus 16. This embodiment of an electroless plating apparatus 16 has a plating tank 200 (see FIG. 14) as a processing tank and a substrate head 204, disposed above the plating tank (processing tank) 200, for detachably holding a substrate W.

Figure 10:
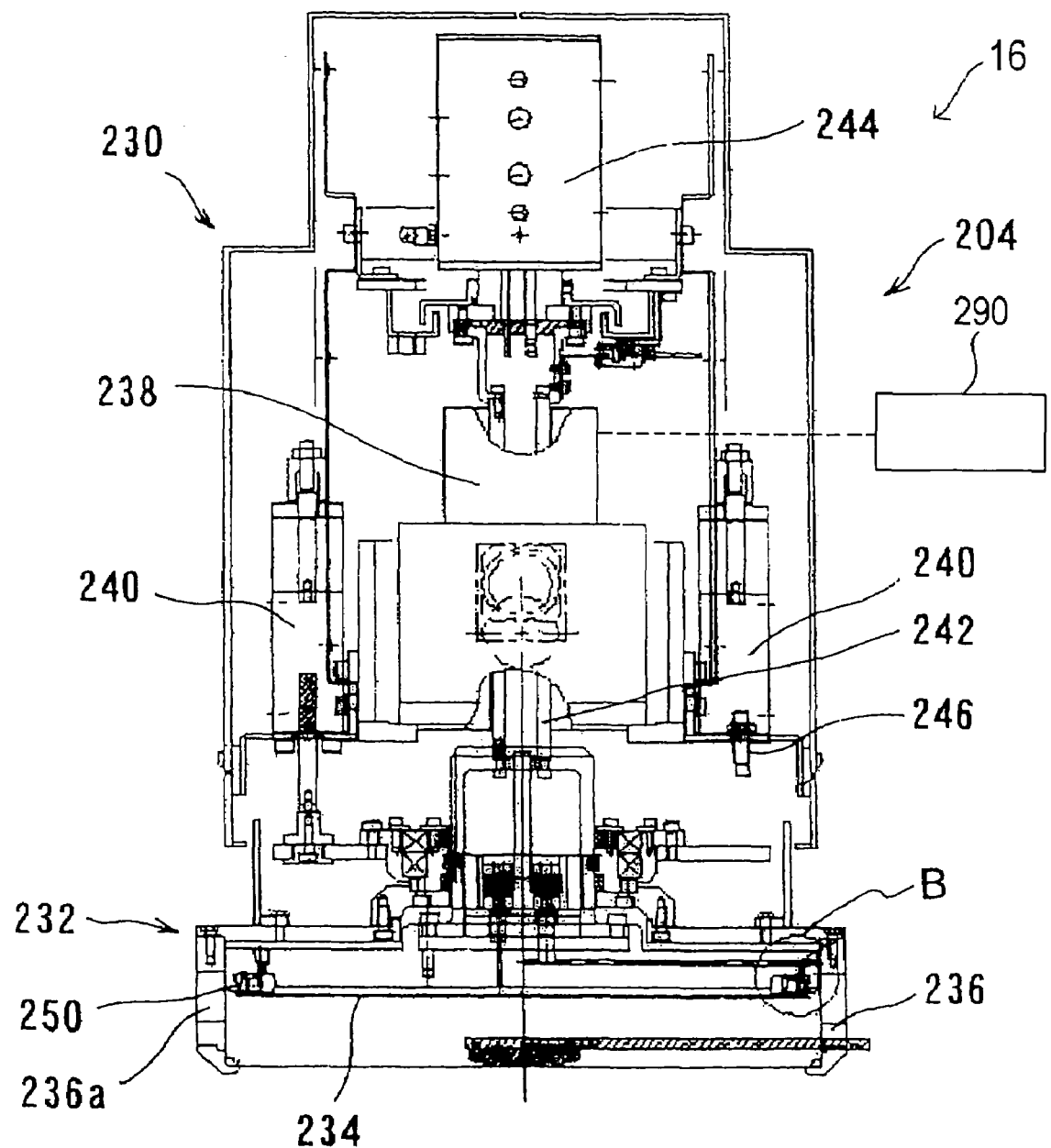
FIG. 10 is a cross-sectional view of the substrate head of the electroless plating apparatus (film-forming apparatus), at a time of transferring a substrate.

As shown in detail in FIG. 10, the substrate head 204 has a housing portion 230 and a substrate holder 232. The substrate holder 232 is mainly composed of a suction head 234 and a substrate receiver 236 surrounding the suction head 234. A substrate rotating motor 238 and substrate receiver driving cylinders 240 are housed in the housing portion 230. An upper end of an output shaft (hollow shaft) 242 of the substrate rotating motor 238 is coupled to a rotary joint 244, and a lower end of the output shaft 242 is coupled to the suction head 234 of the substrate holder 232. Rods of the substrate receiver driving cylinders 240 are coupled to the substrate receiver 236 of the substrate holder 232. Stoppers 246 are provided in the housing portion 230 for mechanically limiting upward movement of the substrate receiver 236.

The substrate rotating motor 238 functions as a rotating device for rotating the substrate holder 232 holding the substrate W. The rotational speed of the substrate rotating motor (rotating device) 238 can be arbitrarily controlled by a signal from a control section 290. The substrate rotating motor (rotating device) 238 and the control section 290 constitute a drive control system for changing the flow state of a plating solution in the vicinity of the surface of the substrate W held by the substrate holder 232 and kept in contact with the plating solution in the plating tank 200. Thus, according to this embodiment, the flow velocity of the plating solution, flowing along the surface of the substrate W held by the substrate holder 232, can be changed by controlling (changing) the rotational speed of the substrate holder 232 by the control section 290.

A splined structure is provided between the suction head 234 and the substrate receiver 236. The substrate receiver 236 is vertically moved relative to the suction head 234 by the actuation of the substrate receiver driving cylinders 240. When the substrate rotating motor 238 is driven to rotate the output shaft 242, the suction head 234 and the substrate receiver 236 are rotated in unison with each other according to the rotation of the output shaft 242.

Figure 11:
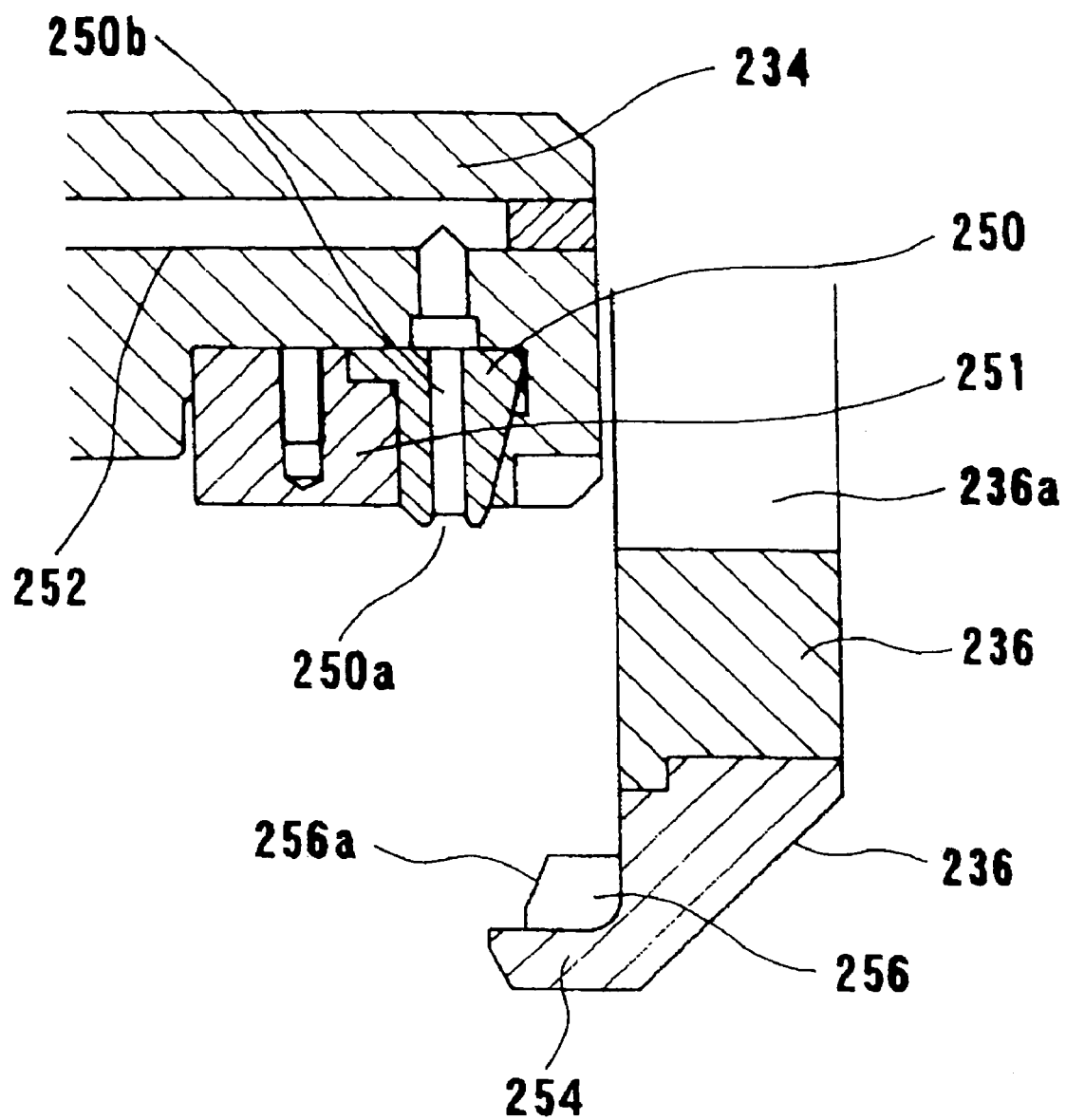
FIG. 11 is an enlarged view of the portion B of FIG. 10.
Figure 12:
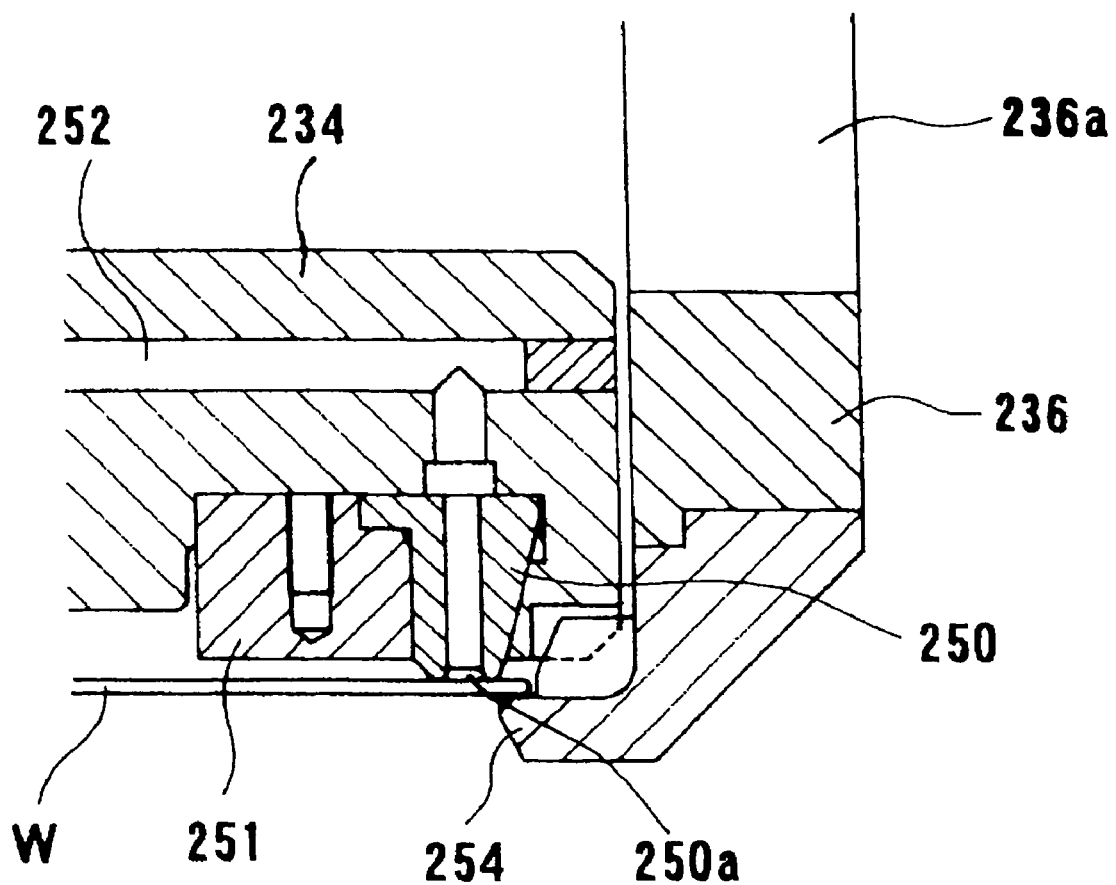
FIG. 12 is a view corresponding to FIG. 11, showing the substrate head of the electroless plating apparatus, at a time of fixing a substrate.
Figure 13:
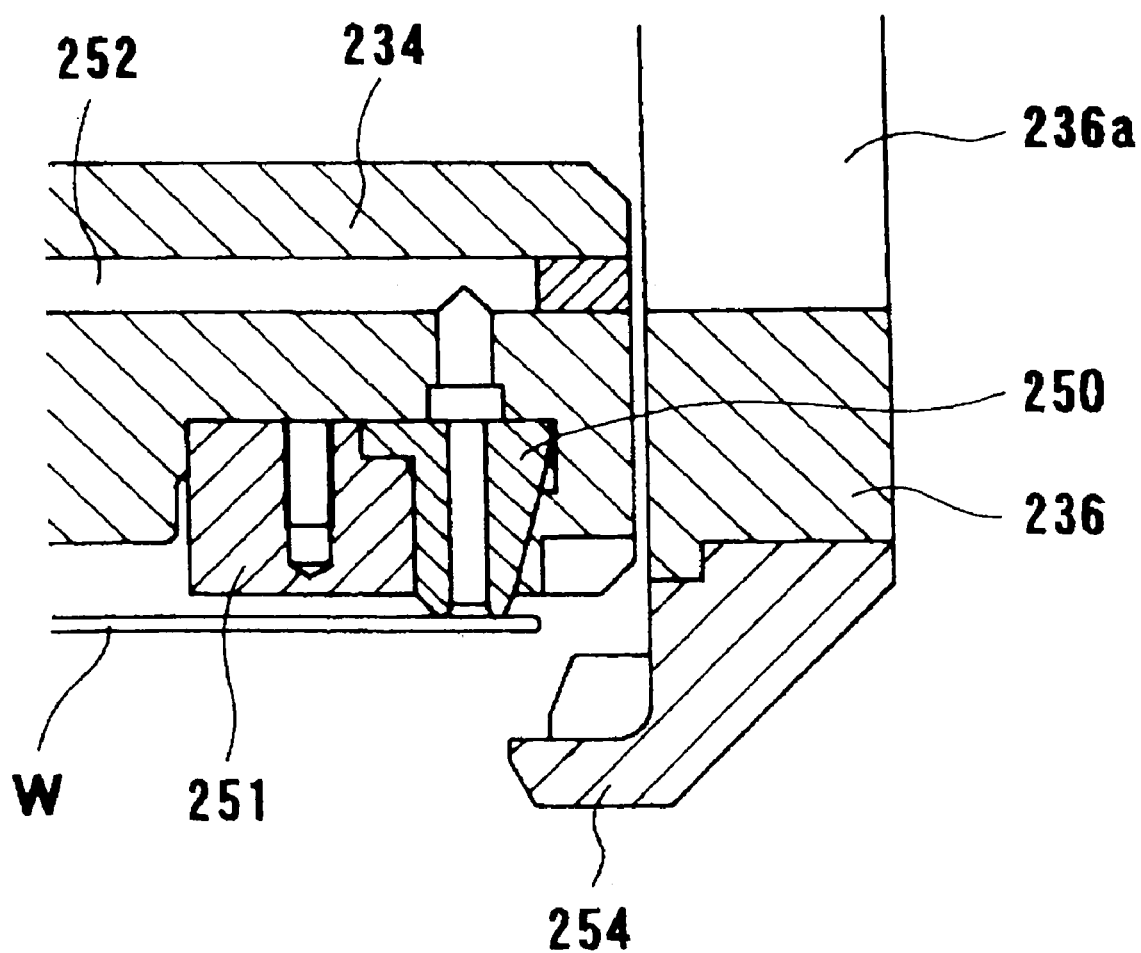
FIG. 13 is a view corresponding to FIG. 11, showing the substrate head of the electroless plating apparatus, at a time of performing a plating process.

As shown in detail in FIGS. 11 through 13, a suction ring 250, for attracting and holding a substrate W against its lower surface to be sealed, can be mounted on a lower circumferential edge of the suction head 234 by a presser ring 251. A recess 250a continuously defined in a lower surface of the suction ring 250 in a circumferential direction communicates with a vacuum line 252 extending inside of the suction head 234 via a communication hole 250b defined in the suction ring 250. By evacuating the recess 250a, the substrate W is attracted and held. Thus, the substrate W is attracted and held under vacuum along a (radially) narrow circumferential area. Accordingly, it is possible to minimize any adverse effects (flexing or the like) caused by the vacuum on the substrate W. Further, when the suction ring 250 is immersed in the plating solution (processing solution), all portions of the substrate W including not only the front face (lower surface) of the substrate W, but also its circumferential edge can be immersed in the plating solution. The substrate W is released by supplying $N_2$ into the vacuum line 252.

Meanwhile, the substrate receiver 236 is in the form of a bottomed cylinder opened downward. Substrate insertion windows 236a for inserting the substrate W into the substrate receiver 236 are defined in a circumferential wall of the substrate receiver 236. A disk-like ledge 254 projecting inward is provided at a lower end of the substrate receiver 236. Protrusions 256 having an inner tapered surface 256a for guiding the substrate W are provided on an upper portion of the ledge 254.

As shown in FIG. 11, when the substrate receiver 236 is in a lowered position, the substrate W is inserted through the substrate insertion window 236a into the substrate receiver 236. The substrate W is then guided by the tapered surfaces 256a of the protrusions 256 and positioned and placed at a predetermined position on an upper surface of the ledge 254 of the substrate receiver 236. In this state, as shown in FIG. 12, the substrate receiver 236 is lifted up so as to bring the upper surface of the substrate W placed on the ledge 254 of the substrate receiver 236 into abutment against the suction ring 250 of the suction head 234. Then, the recess 250a in the vacuum ring 250 is evacuated through the vacuum line 252 to attract and hold the substrate W while sealing the upper peripheral edge of the substrate W against the lower surface of the suction ring 250. For performing a plating process, as shown in FIG. 13, the substrate receiver 236 is lowered several millimeters to space the substrate W from the ledge 254 so that the substrate W is attracted and held only by the suction ring 250. Thus, it is possible to prevent the front face (lower surface) of the peripheral edge portion of the substrate W from not being plated because of the presence of the ledge 254.

Figure 14:
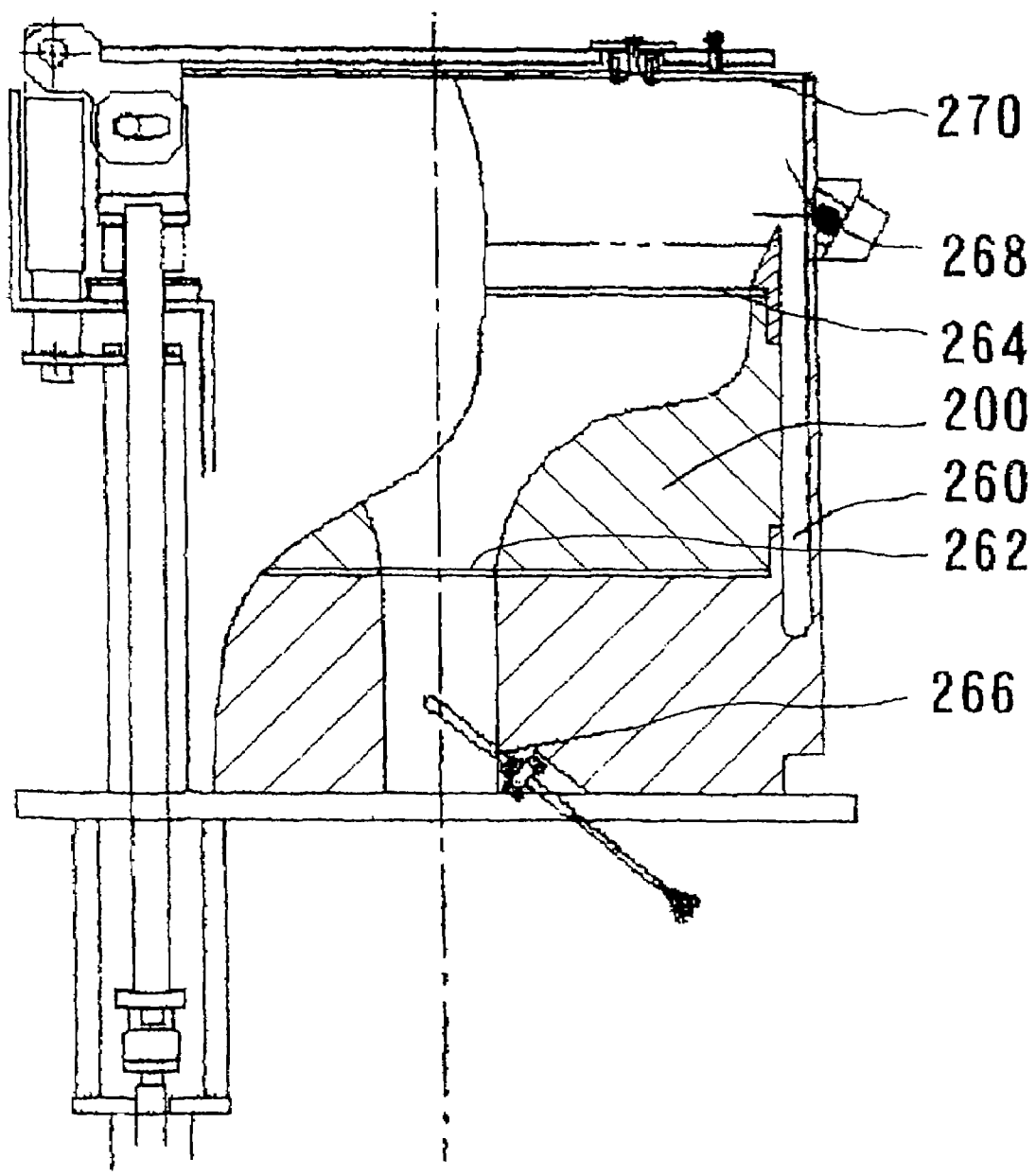
FIG. 14 is a front view, partly broken away, of a plating tank of the electroless plating apparatus when a plating tank cover is closed.

FIG. 14 shows the details of the plating tank 200. The plating tank 200 can be connected at the bottom to a plating solution supply pipe 308 (see FIG. 16) and can be provided in the peripheral wall with a plating solution recovery gutter 260. In the plating tank 200, two current plates 262, 264 for stabilizing the flow of a plating solution flowing upward can be disposed. A thermometer 266 for measuring the temperature of the plating solution to be introduced into the plating tank 200 is disposed at the bottom of the plating tank 200. Further, on the outer surface of the peripheral wall of the plating tank 200 and at a position slightly higher than the liquid level of the plating solution held in the plating tank 200, there is provided an ejection nozzle 268 for ejecting a stop liquid which is a neutral liquid having a pH of 6 to 7.5, for example, pure water, slightly upward with respect to a diametrical direction in the plating tank 200. After the plating, the substrate W held by the substrate holder 232 is lifted up and stopped at a position slightly above the liquid level of the plating solution. In this state, pure water (stop liquid) is ejected from the ejection nozzle 268 toward the substrate W to cool the substrate W immediately, thereby preventing progress of plating by the plating solution remaining on the substrate W.

Further, at a top opening portion of the plating tank 200, there may be provided a plating tank cover 270, capable of opening and closing, which closes the top opening portion of the plating tank 200 so as to prevent unnecessary evaporation of the plating solution from the plating tank 200 when the plating process is not performed, such as at the time of idling.

Figure 16:
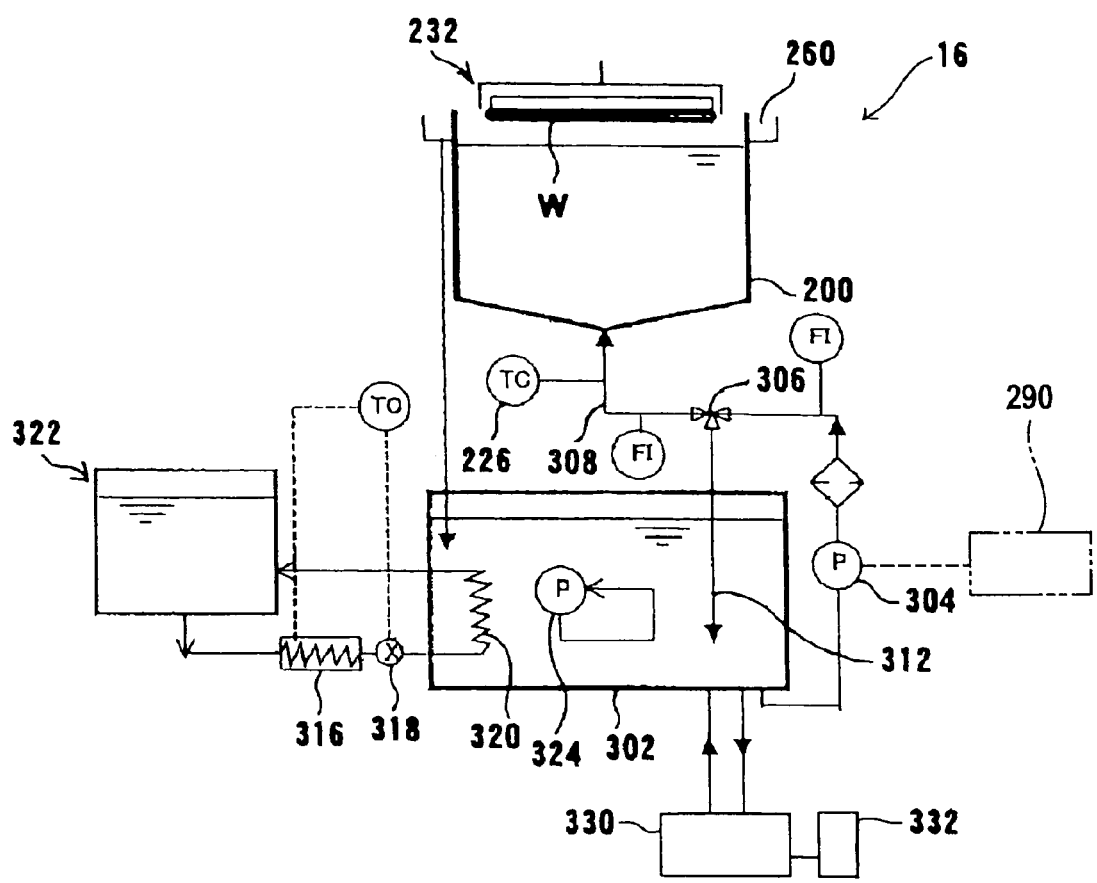
FIG. 16 is a systematic diagram of the electroless plating apparatus.

As shown in FIG. 16, the plating tank 200 may be connected at the bottom to a plating solution supply pipe 308 extending from a plating solution reservoir tank 302 and having a plating solution supply pump 304 and a three-way valve 306. Thus, during a plating process, a plating solution is supplied from the bottom of the plating tank 200 into the plating tank 200, and an overflowing plating solution is recovered to the plating solution reservoir tank 302 by the plating solution recovery gutter 260. Thus, the plating solution can be circulated. A plating solution return pipe 312 for returning the plating solution to the plating solution reservoir tank 302 is connected to one of ports of the three-way valve 306. Accordingly, the plating solution can be circulated even at the time of a standby for plating. Thus, a plating solution circulating system is constructed. As described above, the plating solution in the plating solution reservoir tank 302 is continuously circulated through the plating solution circulating system to thus reduce a rate of lowering the concentration of the plating solution and to increase the number of the substrates W which can be processed, as compared to a case where a plating solution is simply stored.

The plating solution circulation system, which circulates the plating solution during plating, can function as a liquid-flowing device for creating a flow of the plating solution in the plating tank 200. As shown by the dashed lines in FIG. 16, the plating solution supply pump 304 for circulating the plating solution may be controlled by the control section 290 so as to change the circulation amount of the plating solution. Thus, the plating solution supply pump 304 and the control section 290 constitute a drive control system for changing the flow state of the plating solution in the vicinity of the surface of the substrate W held by the substrate holder 232 and kept in contact with the plating solution in the plating tank 200.

Further, though not shown diagrammatically, it is possible to create a circular flow of plating solution within the plating tank, and change the flow state of the plating solution in the vicinity of the surface of a substrate by changing the flow velocity of the circular flow. Further, it is also possible to agitate the plating solution in the plating tank, and change the flow state of the plating solution in the vicinity of the surface of a substrate by changing the intensity of agitation.

The thermometer 266 provided in the vicinity of the bottom of the plating tank 200 measures the temperature of the plating solution to be introduced into the plating tank 200 and controls a heater 316 and a flow meter 318 described below based on the measurement results.

Specifically, in this embodiment, there are provided a heating device 322 for heating the plating solution indirectly by a heat exchanger 320 provided in the plating solution in the plating solution reservoir tank 302 and employing, as a heating medium, water that has been increased in temperature by a separate heater 316 and passed through the flow meter 318, and a stirring pump 324 for circulating the plating solution in the plating solution reservoir tank 302 to stir the plating solution. This is because the apparatus should be arranged so that the apparatus can cope with a case where the plating solution is used at a high temperature (about 80° C.). This method can prevent an extremely delicate plating solution from being mixed with foreign matter or the like, unlike an in-line heating method.

Figure 15:
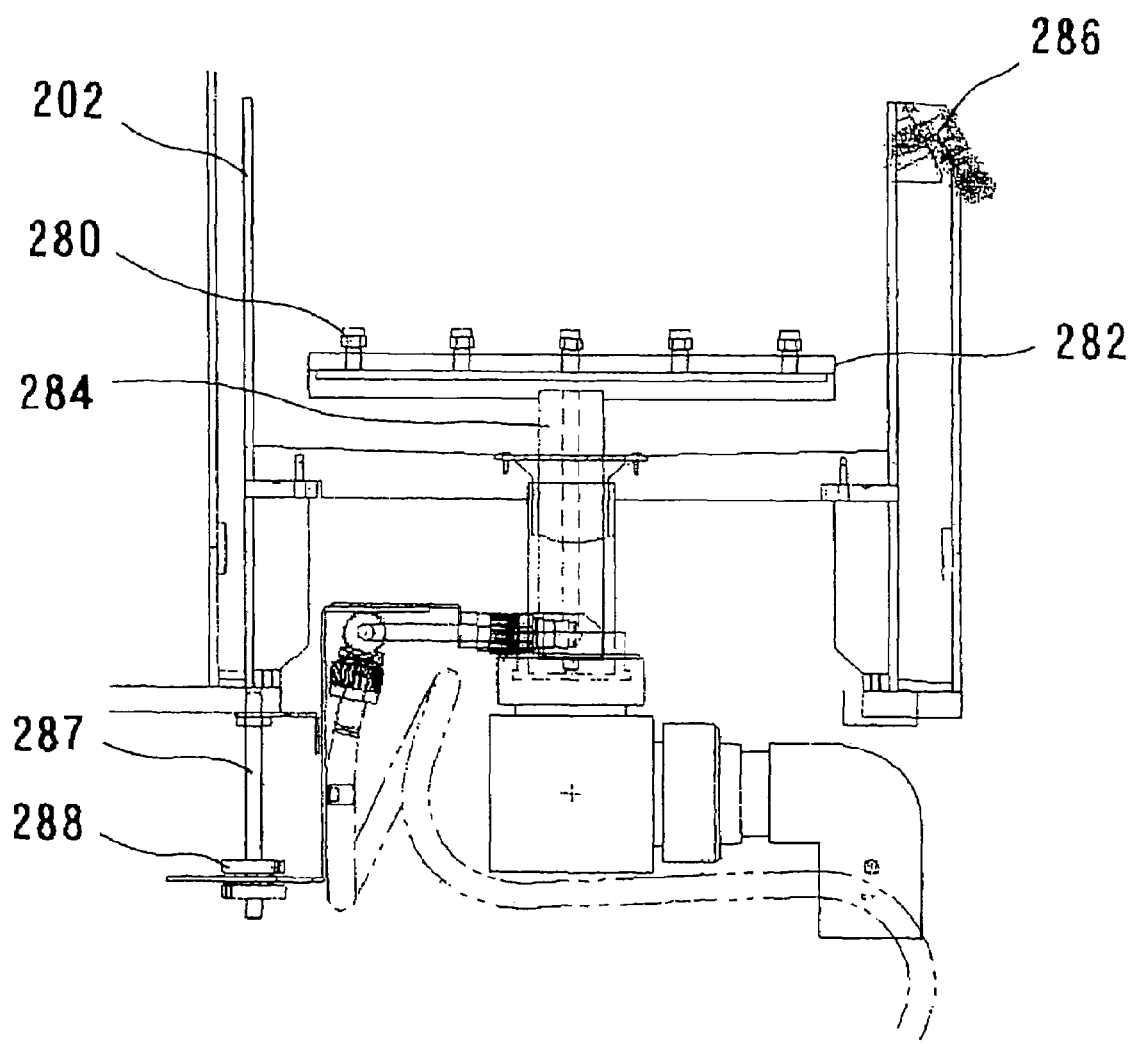
FIG. 15 is a cross-sectional view of a cleaning tank of the electroless plating apparatus.

FIG. 15 shows an embodiment of the details of a cleaning tank 202 provided beside the plating tank 200. At the bottom of the cleaning tank 202, there is provided a nozzle plate 282 onto which a plurality of ejection nozzles 280 for ejecting a rinsing liquid such as pure water upward are attached. The nozzle plate 282 is coupled to an upper end of a nozzle vertical shaft 284. The nozzle vertical shaft 284 can be moved vertically by changing positions of engagement between a nozzle position adjustment screw 287 and a nut 288 engaging the screw 287 so as to optimize a distance between the ejection nozzles 280 and the substrate w disposed above the ejection nozzles 280.

Further, on the outer surface of the peripheral wall of the cleaning tank 202 and at a position higher than the ejection nozzles 280, there is provided a head cleaning nozzle 286 for ejecting a cleaning liquid, such as pure water, slightly downward with respect to a diametric direction in the cleaning tank 202 to blow the cleaning liquid to at least a portion of the substrate holder 232 of the substrate head 204 which is brought into contact with the plating solution.

In the cleaning tank 202, the substrate W can be held by the substrate holder 232 of the substrate head 204 is located at a predetermined position in the cleaning tank 202. A cleaning liquid (rinsing liquid), such as pure water may be ejected from the ejection nozzles 280 to clean (rinse) the substrate W. At that time, a cleaning liquid such as pure water is ejected from the head cleaning nozzle 286 to clean, with the cleaning liquid, at least a portion of the substrate holder 232 of the substrate head 204 which is brought into contact with the plating solution, thereby preventing a deposit from accumulating on a portion which is immersed in the plating solution.

In the operation of the electroless plating apparatus 16, the substrate W can be attracted and held by the substrate holder 232 of the substrate head 204, which is in the raised position, in the manner described above, and the plating solution in the plating tank 200 is allowed to circulate.

When carrying out plating, the plating tank cover 270 of the plating tank 200 is opened, and the substrate head 204 is lowered while rotating it to immerse the substrate W, held by the substrate holder 232, in the plating solution in the plating tank 200, thereby forming an interconnects-protective film (metal film) 9 selectively on surfaces of interconnects 8 of, for example, a CoWP alloy to protect the interconnects 8, as shown in FIG. 1D.

The flow state of the plating solution in the vicinity of the surface of the substrate W, held by the substrate holder 232, may be changed during the plating so as to form the interconnects-protective film (metal film) 9 of CoWP alloy, having different film qualities in the thickness direction, on the surfaces of the interconnects (base metal) 8 in a continuous manner. The formation of the metal film 9, having different film qualities in the thickness direction, is thus carried out in a continuous manner using the same plating solution. In particular, according to this embodiment, the substrate W is rotated at a low rotational speed, for example, 1 to 30 rpm, preferably 3 to 25 rpm, more preferably 8 to 18 rpm in the early stage of plating. In the later stage of plating, the rotational speed of the substrate W is increased and the substrate W is rotated at a high rotational speed, for example, at 10 to 500 rpm, preferably 20 to 200 rpm, and more preferably 30 to 60 rpm. The flow velocity of the plating solution in the vicinity of the surface of the substrate W is thus increased during the film formation.

By thus increasing the flow velocity of the plating solution in the vicinity of the surface of the substrate W during plating, it becomes possible to increase the W concentration of the plating solution present in the vicinity of the surface of the substrate W and to thereby make the W content of the metal film formed in the later stage of plating higher than the W content of the metal film formed in the early stage of plating. The principle in this regard will now be described.

A plating solution for use in electroless CoWP plating generally may comprise a Co metal salt (component A), a reducing agent containing P (component B), a W metal salt (component C), a complexing agent (component D), a buffering agent (component E), and a pH adjusting agent (component F). The film quality of a metal film of a Co alloy is affected by the concentrations of the components A to F (or the supply of the components) in the plating solution present in the vicinity of the substrate of a substrate. The concentration range of each of the components A to F, which affects the film quality of the metal film, may vary depending on the reaction system.

Figure 19:
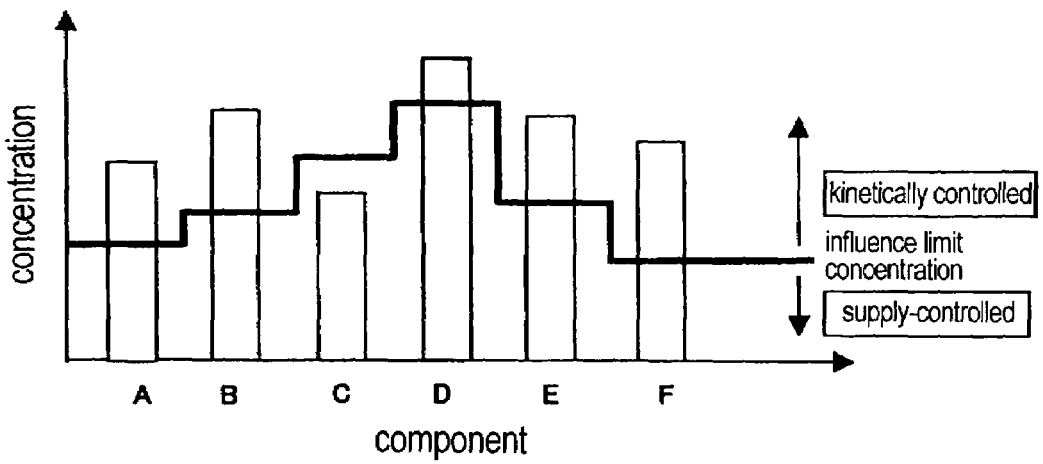
FIG. 19 is a graphical diagram showing an example of the concentrations of components A to F in a plating solution, and also showing an example of the limit concentration of each component in terms of its influence on the film quality of the resulting metal film.

FIG. 19 shows an example of the concentrations of the components A to F in the plating solution present in the vicinity of the surface of a substrate, and also shows, by the thick line, an example of the limit concentration of each component in terms of its influence on the film quality of the metal film. When the concentrations of the components A, B and D to F are above their influence limit concentrations as shown in FIG. 19, the rate of the reaction associated with the components A, B and D to F is under kinetic control, and a change in the concentration of each of the components A, B and D to F exerts no direct influence on the film quality of the metal film deposited. On the other hand, when the concentration of the component C (W metal salt) in the plating solution present in the vicinity of the substrate surface is below the influence limit concentration, the reaction associated with the component C is under supply control, and a change in the concentration of the component C directly affects the film quality of the metal film deposited.

When the flow state of a plating solution changes in the vicinity of the surface of a substrate, a concentration boundary layer, which governs transfer of a substance, changes its thickness, leading to a change in the concentration of each component of the plating solution in the vicinity of the substrate surface. In general, as the flow velocity of the plating solution becomes faster in the vicinity of the substrate surface, the concentration boundary layer of the components of the plating solution becomes thinner, whereby the diffusion of the components in the vicinity of the substrate surface may be promoted. Thus, the concentration of each component in the plating solution in the vicinity of the substrate surface can be changed so as to change the film quality of the plating film formed, by changing the flow state of the plating solution in the vicinity of the substrate surface during plating.

In particular, when the flow velocity of plating solution is increased in the vicinity of a surface of a substrate during the formation of a metal film of a W-containing Co alloy on the substrate surface, the concentrations of all the components in the plating solution present in the vicinity of the substrate surface may become higher than those before the increase in the flow velocity of the plating solution. With respect to the components other than W, the concentration change may slightly affect the film quality of the metal film. In contrast, the increase in the concentration of the W metal salt results in a higher W content in the metal film deposited. As the concentration of the W metal salt in the plating solution increases, the deposition of the metal film may become slower and the reaction rate may become more kinetically controlled and less affected by diffusion that governs supply of the components, and the thickness of the metal film becomes less dependent on the interconnect width or the density of the interconnects. Thus, the pattern dependency of the metal film (plated film) can be reduced.

As will be appreciated from the above, a metal film of CoWP alloy, for example, having different W concentrations in the thickness direction, can be formed on the surfaces of interconnects in a continuous manner by changing the rotational speed of a substrate W during plating. In particular, by making the rotational speed of the substrate W higher in the later stage of plating than in the early stage of plating to make the W concentration of the plating solution in the vicinity of the substrate surface higher in the later stage of plating than in the early stage of plating, it becomes possible to form the metal film, having a W content of e.g. not more than 2 wt %, in the early stage of plating so as to make the metal film less affected by the surface morphology of the base metal (interconnects), and to form the metal film, having a W content of e.g. not less than 2 wt %, in the later stage of plating so as to make the thickness of the metal film less dependent on the interconnect width and the density of the interconnects in the substrate surface.

Figure 1A:
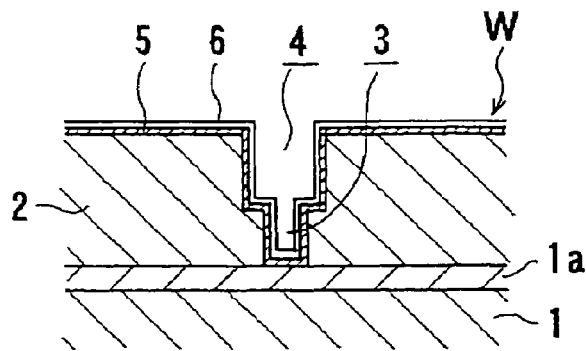
FIGS. 1A through 1D are diagrams illustrating, in a sequence of process steps, an example of forming copper interconnects in a semiconductor device.

While the above description illustrates the case of forming an interconnects-protective film (metal film) of CoWP alloy, the same substantially applies to the case of forming a metal film composed of a single metal, such as copper, on a substrate surface by electroplating so as to fill contact holes 3 and trenches 4, as shown in FIG. 1A, with the metal film (copper). Thus, it is possible to form a metal film, having different properties (film qualities), such as copper orientation and resistivity, in the thickness direction, on a surface of a substrate in a continuous manner by changing the flow state of a plating solution (processing solution) in the vicinity of the substrate surface during plating so as to adjust the content of an additive in the metal film.

After keeping the substrate W immersed in the plating solution for a predetermined time, the substrate head 204 is raised to pull up the substrate W from the plating solution in the plating tank 200 and, according to necessity, pure water (stop liquid) is ejected from the ejection nozzle 268 toward the substrate W to rapidly cool the substrate W. The substrate head 204 is further raised to move the substrate W to a position above the plating tank 200, and the rotation of the substrate head 204 is stopped.

Next, the substrate head 204 may be moved to a position right above the cleaning tank 202 while keeping the substrate W attracted and held by the substrate holder 232 of the substrate head 204. Thereafter, while rotating the substrate head 204, the substrate head 204 may be lowered to a predetermined position in the cleaning tank 202. A cleaning liquid (rinsing liquid), such as pure water is ejected from the ejection nozzle 280 to clean (rinse) the substrate W and, at the same time, a cleaning liquid, such as pure water, may be ejected from the head cleaning nozzle 286 to clean with the cleaning liquid at least those portions of the substrate holder 232 of the substrate head 204 which contact the plating solution.

After completion of the cleaning of the substrate W, the rotation of the substrate head 204 is stopped, and the substrate head 204 is raised to pull up the substrate W to a position above the cleaning tank 202. The substrate head 204 may then be moved to a transfer position where the substrate W is transferred to the second substrate transport robot 26, and the substrate W is sent to the next process step.

Figure 17:
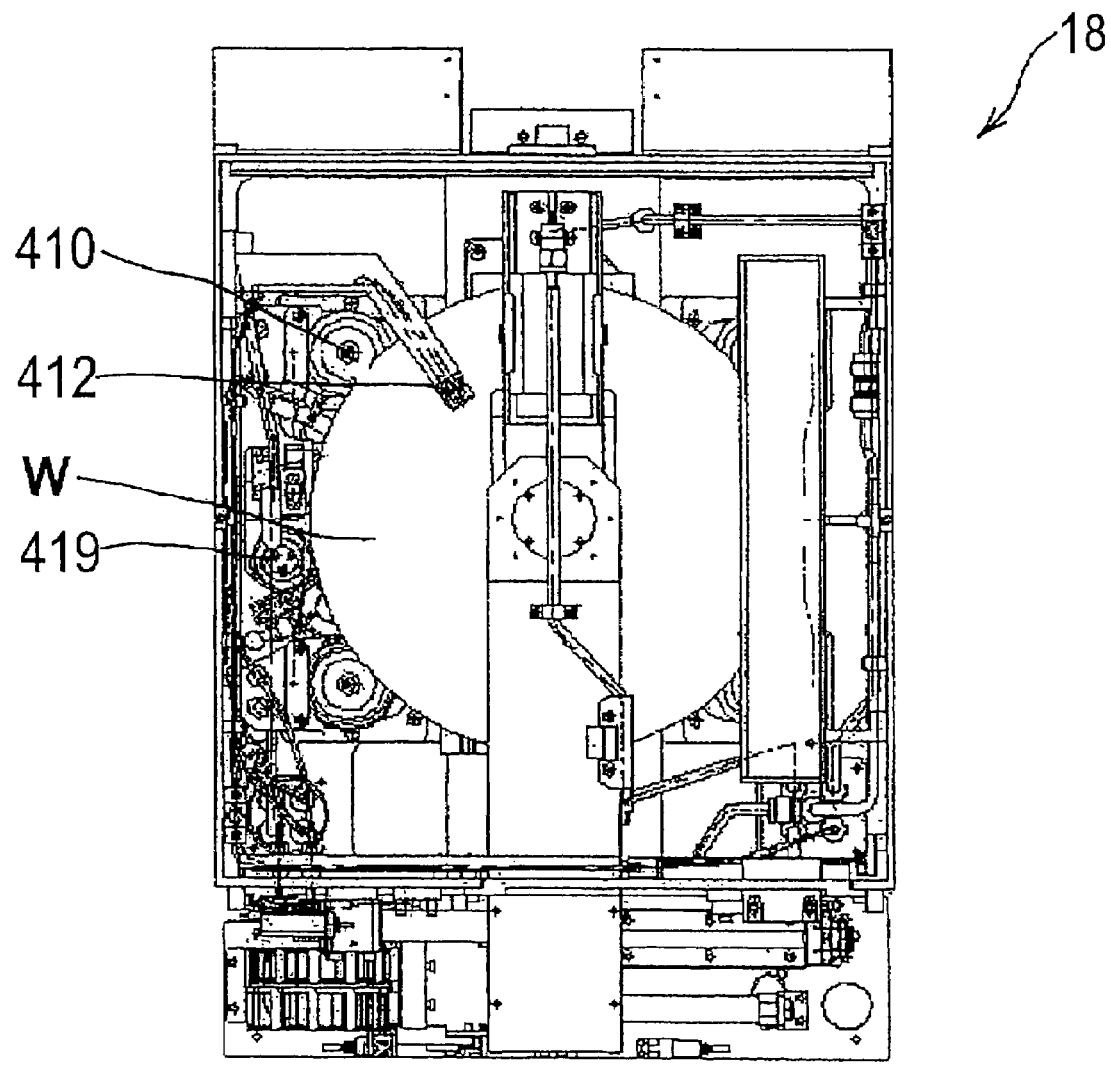
FIG. 17 is a plan view of a post-processing apparatus.

FIG. 17 shows an embodiment of the post-plating processing apparatus 18. The post-processing apparatus 18 is an apparatus for forcibly removing particles and unnecessary matters on the substrate W with a roll-shaped brush, and includes a plurality of rollers 410 for holding the substrate W by nipping its peripheral portion, a chemical nozzle 412 for supplying a processing liquid (two lines) to the front surface of the substrate W held by the rollers 410, and a pure water nozzle (not shown) for supplying pure water (one line) to the back surface of the substrate W.

In operation, the substrate W is held by the rollers 410 and a roller drive motor is driven to rotate the rollers 410 and thereby rotate the substrate W, while predetermined processing liquids are supplied from the chemical nozzle 412 and the pure water nozzle to the front and back surfaces of the substrate W and the substrate W is nipped between not-shown upper and lower roll sponges (roll-shaped brushes) at an appropriate pressure, thereby cleaning the substrate W. It is also possible to rotate the roll sponges independently so as to increase the cleaning effect.

The post-plating processing apparatus 18 also includes a sponge (PFR) 419 that rotates while contacting the edge (peripheral portion) of the substrate W, thereby scrub-cleaning the edge of the substrate W.

Figure 18:
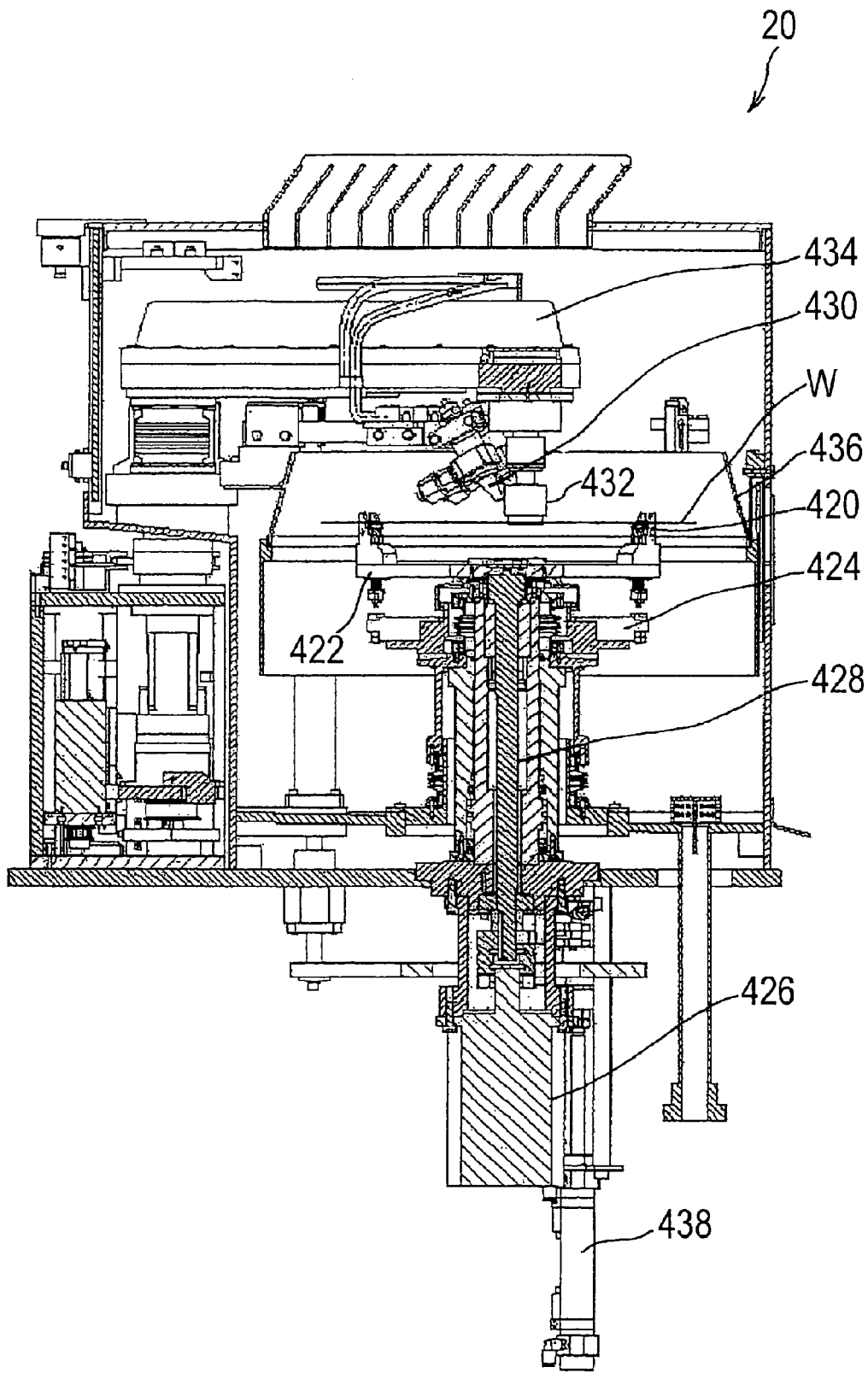
FIG. 18 is a vertical sectional front view of a drying apparatus.

FIG. 18 shows an embodiment of the drying apparatus 20. The drying apparatus 20 is an apparatus for first carrying out chemical cleaning and pure water cleaning of the substrate W, and then fully drying the cleaned substrate W by spindle rotation, and includes a substrate stage 422 provided with a clamping mechanism 420 for clamping an edge portion of the substrate W, and a substrate attachment/detachment lifting plate 424 for opening/closing the clamping mechanism 420. The substrate stage 422 is coupled to the upper end of a spindle 428 that rotates at a high speed by the actuation of a spindle rotating motor 426.

Further, positioned on the side of the upper surface of the substrate W clamped by the clamping mechanism 420, there may be provided a mega-jet nozzle 430 for supplying pure water to which ultrasonic waves from a ultrasonic oscillator have been transmitted during its passage through a special nozzle to increase the cleaning effect, and a rotatable pencil-type cleaning sponge 432, both mounted to the free end of a pivot arm 434. In operation, the substrate W may be clamped by the clamping mechanism 420 and rotated, and the pivot arm 434 is pivoted while pure water is supplied from the mega-jet nozzle 430 to the cleaning sponge 432 and the cleaning sponge 432 is rubbed against the front surface of the substrate W, thereby cleaning the front surface of the substrate W. A cleaning nozzle (not shown) for supplying pure water is provided also on the side of the back surface of the substrate W, so that the back surface of the substrate W can also be cleaned with pure water sprayed from the cleaning nozzle.

The thus-cleaned substrate W may be spin-dried by rotating the spindle 428 at a high speed.

A cleaning cup 436, surrounding the substrate W clamped by the clamping mechanism 420, is provided for preventing scattering of a cleaning liquid. The cleaning cup 436 is designed to move up and down by the actuation of a cleaning cup lifting cylinder 438.

It is also possible to provide the drying apparatus 20 with a cavi-jet function utilizing cavitation.

Next, a description of an exemplary series of substrate processings (electroless plating processings) as carried out by this substrate processing apparatus follows.

First, one substrate W is taken by the first substrate transport robot 24 out of the cassette set in the loading/unloading unit 10 and housing substrates W with their front surfaces facing upwardly (face up), each substrate W having been subjected to the formation of interconnects 8 in the surface, followed by drying, as shown in FIG. 1C, and the substrate W is transported to the temporary storage table 22 and placed on it. The substrate W on the temporary storage table 22 is transported by the second substrate transport robot 26 to the cleaning/catalyst applying apparatuses 14. In the cleaning/catalyst applying apparatuses 14, the substrate W is held face down, and cleaning of the front surface with a cleaning liquid (chemical) is carried out as a pre-plating processing.

The cleaning liquid is sprayed toward the surface of the substrate W, for example, for one minute to thereby etch away an oxide, etc. on the interconnects 8 and activate the surfaces of interconnects 8 and, at the same time, remove CMP residues remaining on the surface of the substrate W. Thereafter, the cleaning liquid remaining on the surface of the substrate W is rinsed (cleaned) with a rinsing liquid, such as pure water, according to necessity.

Next, while the substrate W is kept held face down in the cleaning/catalyst applying apparatuses 14, catalyst application processing for applying a catalyst, such as Pd, to the surface of the substrate W is carried out successively. In particular, a processing solution (catalyst processing solution), which is prepared by mixing a solution containing a catalyst metal ion, for example, a solution obtained by dissolving $PdSO_4$ as a catalyst metal supply source in an aqueous solution of an inorganic acid, such as $H_2SO_4$, with the same cleaning liquid as used in the above cleaning, is sprayed toward the surface of the substrate W, for example, for one minute to thereby apply Pd as a catalyst to the surfaces of interconnects 8. Thus, Pd seeds as catalyst seeds are formed on the surfaces of interconnects 8, whereby the exposed surfaces of interconnects 8 is activated. Thereafter, the processing solution remaining on the surface of the substrate W is rinsed (cleaned) with a rinsing liquid, such as pure water.

Besides Pd ion used in this embodiment, Sn ion, Ag ion, Pt ion, Au ion, Cu ion, Co ion or Ni ion can be used as s catalyst metal ion. The use of Pd ion is especially preferred from the viewpoints of reaction rate, easiness of control, etc. Further, besides $H_2SO_4$ used in this embodiment, other inorganic acid, such as HCl, $HNO_3$ or HF, or an organic acid, such as a carboxylic acid or an alkanesulfonic acid, can be used as an aqueous solvent for a catalyst metal ion.

The surface of the substrate W after catalyst application is rinsed (cleaned) with a rinsing liquid, such as pure water, then is transported by the second substrate transport robot 26 to the electroless plating apparatus 16, where electroless plating is carried out onto the surface of the substrate W. Specifically, the surface of the substrate W may be brought into contact with, for example, a CoWP plating solution at the solution temperature of 80° C. for about 120 seconds to carry out electroless plating (electroless CoWP cap plating) selectively on the surfaces of interconnects 8, to which Pd as a catalyst is applied, so as to selectively form a interconnects-protective film (cap material) 9. The composition of the plating solution may be as follows.

Plating Solution Composition
$CoSO_4.7H_2O$: 23 g/L
$Na_3C_6H_5O_7.2H_2O$: 145 g/L
$(NH_4)_2SO_4$: 31 g/L
$NaH_2PO_2.H_2O$: 18 g/L
$Na_2WO_4.2H_2O$: 10 g/L
pH: 9.2 (adjusted by aqueous NaOH)

As described above, in the early stage of plating, the substrate w is rotated at a low rotational speed, for example, 1 to 30 rpm, preferably 3 to 25 rpm, more preferably 8 to 15 rpm, for example for 60 seconds, thereby forming the metal film, for example having a W content of not more than 2 wt %, which is less affected by the surface morphology of the base metal (interconnects). In the subsequent later stage of plating, the rotational speed of the substrate W is increased and the substrate W is rotated at a high rotational speed, for example, 10 to 500 rpm, preferably 20 to 200 rpm, more preferably 30 to 60 rpm, for example for 120 seconds. By thus increasing the flow velocity of the plating solution in the vicinity of the surface of the substrate W during the film formation, the metal film having a higher W content, for example not less than 2 wt %, whose thickness is less dependent on the interconnect width and the density of the interconnects, is formed in the later stage of plating.

After completion of the plating, the substrate W can be lifted up from the plating solution, and then a stop liquid of a neutral liquid having a pH of 6 to 7.5 is brought into contact with the surface of the substrate W to stop the electroless plating process. Thus, the plating reaction is quickly stopped immediately after the substrate W is lifted up from the plating solution, to thereby prevent plating unevenness from being produced on the plated film. It is desirable that this processing time be, for example, 1 to 5 seconds. Pure water, hydrogen gas dissolved water, or electrolytic cathode water is used as the stop liquid.

Thereafter, a plating solution remaining on the surface of the substrate is rinsed (cleaned) with a rinsing liquid such as pure water. Thus, an interconnects-protective film 9 of a CoWP alloy film is formed selectively on surfaces of interconnects 8 to protect the interconnects 8.

Next, the substrate W after the electroless plating process is transferred to the post-plating processing apparatus 18 by the second substrate transport robot 26. In the post-plating processing unit 18, a post-plating processing (past-cleaning) is performed to improve the selectivity of the interconnects-protective film (metal film) 9 formed on the surface of the substrate W and enhance a yield. Specifically, while a physical force, for example, through roll scrubbing cleaning or pencil cleaning, is applied to the surface of the substrate W, a post-plating processing liquid (chemical liquid) is supplied to the surface of the substrate W to completely remove plating residues such as fine metallic particles on the interlevel dielectric film 2 and improve the selectivity of the plating.

The substrate W after the post-plating processing is transferred by the second substrate transport robot 26 to the drying apparatus 20, where the substrate W is rinsed, according to necessity, and then rotated at a high speed to spin-dry the substrate W.

The spin-dried substrate is placed on the temporary storage table 22 by the second substrate transport robot 26. The substrate placed on the temporary storage table 22 is returned to the substrate cassette set in the loading/unloading unit 10 by the first substrate transport robot 24.

Though in this embodiment a metal film (interconnects-protective film) of a CoWP alloy is formed, it is also possible to form a metal film (interconnects-protective film) of other Co alloy, such as CoWB, CoP, CoB, etc. or a metal film of a Ni alloy, such as NiWP, NiWB, NiP, NiB, etc. Further, it is also possible to a form an interconnects-protective film of a nonmetal, such as SiN, SiC, SiCN, etc. by a wet process.

Figure 1B:
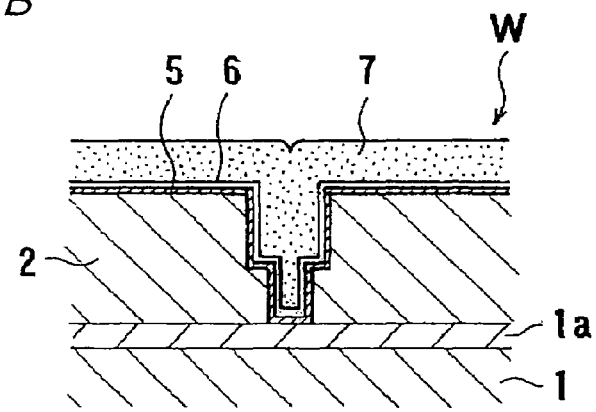
Figure 1D:
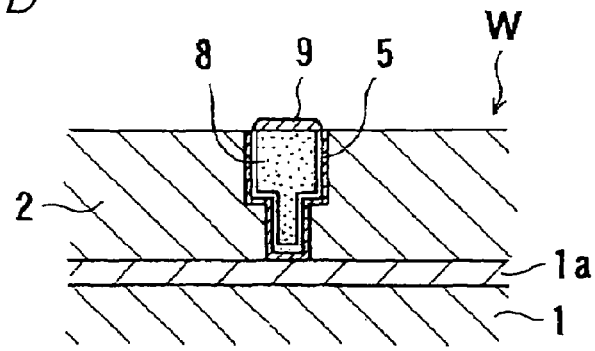

Further, it is also possible to form a copper film (metal film) 7 as shown in FIG. 1B, for example by electroplating, on the surface of a substrate W, as shown in FIG. 1A, having contact holes 3 and trenches 4 as interconnect recesses. In this case, the metal film having different properties (film qualities), such as copper orientation and resistivity, in the thickness direction, can be formed on the substrate surface in a continuous manner by changing the flow state of a processing solution (plating solution) in the vicinity of the substrate surface so as to adjust the content of an additive in the metal film.

EXAMPLE 1

A 300 mm-diameter semiconductor wafer, having a copper film formed over the surface, was prepared as sample 1. A series of electroless plating processings of the surface of sample 1 was carried out under the processing conditions shown in Table 1 below to form a metal film of CoWP alloy on the surface of sample 1.

TABLE 1

|  | Seed Application | Rinsing | Plating | Rinsing | Rinsing | Drying |
|---|---|---|---|---|---|---|
| Chemical used | Sulfuric acid Solution containing Pd | DIW | CoWP plating solution | DIW | DIW |  |
| Processing method | Spraying | Spraying | Immersion in processing solution | Spraying | Spinning | Spinning |
| Processing time (s) | 30 | 30 | 180 | 30 | 30 | 30 |

The electroless plating was carried out in the following manner: Using a CoWP-plating solution having the same composition as described above, electroless plating was carried out while rotating the sample 1 at a low rotational speed N (N=15 rpm) for 60 seconds in the early stage of plating; and electroless plating was carried out while rotating the sample 1 at a high speed 3N (3N=45 rpm) for 120 seconds in the later stage of plating (Example 1).

For comparison, using the same plating solution, electroless plating was carried out while rotating sample 1 at a low constant rotational speed N(N=15 rpm) for 180 seconds, thereby forming a metal film (CoWP alloy) on the surface of sample 1 (Comparative Example 1-1). Similarly, electroless plating was carried out at a high constant rotational speed 3N (=45 rpm) for 180 seconds, thereby forming a metal film (CoWP alloy) on the surface of sample 1 (Comparative Example 1-2).

The metal films (CoWP alloy) obtained above were subjected to quantitative analysis to determine the contents (at %) of the metal components. The analytical results are shown in Table 2.

TABLE 2

| | Sample rotational speed | Content of metal component in film (at %) | | |
|---|---|---|---|---|
| | (rpm)/processing time | Co | W | P |
| Comp. Example 1-1 | N/180 | 80-90 | Cw | 5-15 |
| Comp. Example 1-2 | 3N/180 | 80-90 | 1.2Cw | 5-15 |
| Example 1 | N/60 + 3N/120 | 80-90 | 1.1Cw | 5-15 |

Table 2 shows that the W content of the metal film, obtained by carrying out electroless plating while rotating the substrate at the constant high rotational speed 3N, is 1.2 times the W content of the metal film obtained by carrying out electroless plating while rotating the substrate at the constant low rotational speed N. This demonstrates that with the use of the same plating solution having the same composition, the use of different rotational speeds of the substrate produces a difference in the W content of the metal film formed, and the use of a higher rotational speed of the substrate provides the metal film having a higher W content. The data in Table 2 also shows that when changing the rotational speed of the substrate from the low rotational speed N to the high rotational speed 3N during the film formation, the resulting metal film has the W content which is intermediate between the W content of the metal film obtained by plating with the rotation of the substrate at the constant rotational speed N and the W content of the metal film obtained by plating with the rotation of the substrate at the constant rotational speed 3N.

The metal films obtained in Example 1 and Comparative Examples 1-1 and 1-2 were also subjected to secondary ion mass spectrometry (SIMS) to determine the distribution of W content in each metal film. The results are shown in FIG. 20.

Figure 20:
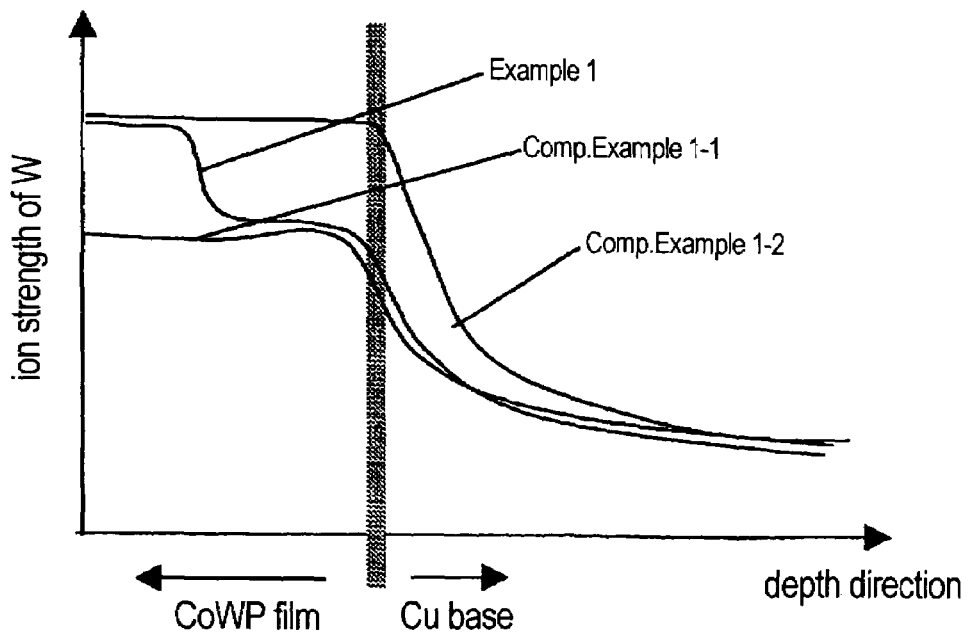
FIG. 20 is a graphical diagram showing the results of SIMS analysis of the W contents of the metal films obtained in Example 1 and Comparative Examples 1-1 and 1-2.

As can be seen from the data in FIG. 20, the metal film having different W contents in the thickness direction can be formed on the surface of sample 1 in a continuous manner in Example 1 by changing the rotational speed of sample 1 from the low rotational speed N to the high rotational speed 3N during the film formation.

EXAMPLE 2

A 300 mm-diameter semiconductor wafer, having a sparse interconnect region in which interconnects are sparely provided in the surface and a dense interconnect region in which interconnects are densely provided in the surface, was prepared as sample 2. A series of electroless plating processings of the surface of sample 2 was carried out under the processing conditions shown in Table 1 above to form a metal film of CoWP alloy selectively on the interconnects of sample 2.

The electroless plating was carried out in the following manner: Using a CoWP-plating solution having the same composition as described above, electroless plating was carried out while rotating sample 2 at a low rotational speed N(N=15 rpm) for 60 seconds in the early stage of plating; and electroless plating was carried out while rotating sample 2 at a high speed 3N (3N=45 rpm) for 120 seconds in the later stage of plating (Example 2).

For comparison, using the same plating solution, electroless plating was carried out while rotating the sample 2 at a low constant rotational speed N(N=15 rpm) for 180 seconds, thereby forming a metal film (CoWP alloy) selectively on the surfaces of the interconnects of the sample 2 (Comparative Example 2-1). Similarly, electroless plating was carried out at a high constant rotational speed 3N (=45 rpm) for 180 seconds, thereby forming a metal film (CoWP alloy) selectively on the surfaces of the interconnects of sample 2 (Comparative Example 2-2).

For the metal films (CoWP alloy) obtained, the surface roughness Ra (by AFM (atomic force microscopy)) and the thickness ratio between the metal film formed on the sparse interconnects and the metal film formed on the dense interconnects were measured. The measurement results are shown in Table 3.

TABLE 3

| | Sample rotational speed (rpm)/ Processing time | Surface roughness of metal film (Ra) | Film thickness Ratio |
|---|---|---|---|
| Comp. Example 2-1 | N/180 | X | 4:1 |
| Comp. Example 2-2 | 3N/180 | 1.3 X | 1:1 |
| Example 2 | N/60 + 3N/120 | 1.1 X | 1.2:1 |

As apparent from Table 3, the metal film formed by carrying out electroless plating while rotating the substrate at the low constant rotational speed N has good or low surface roughness. The metal film, however, is highly pattern-dependent as shown by the high thickness ratio 4:1 between the metal film formed on the sparse interconnects and the metal film formed on the dense interconnects. Meanwhile, the metal film formed by carrying out electroless plating while rotating the substrate at the high constant rotational speed 3N is little pattern-dependent as shown by the 1:1 thickness ratio between the metal film formed on the sparse interconnects and the metal film formed on the dense interconnects. However, the surface roughness of the metal film is 1.3 times higher than the metal film obtained by electroless plating with the rotation of the substrate at the constant low rotational speed N. In contrast, the metal film obtained in Example 2 is improved in the surface roughness and in the thickness ratio between the metal film formed on the sparse interconnects and the metal film formed on the dense interconnects.

The present invention makes it possible to form a metal film (interconnects-protective film), having different film qualities in the thickness direction, in a continuous manner using a single processing solution. For example, it is possible to form a metal film of CoWP alloy which, due to its different W contents in the thickness direction, is improved in the surface roughness and pattern dependency, selectively on surfaces of interconnects formed on a substrate to protect the interconnects.

What is claimed is:

1. A method for forming a metal film made of a Co alloy containing W by electroless plating, comprising:
   providing a substrate having embedded interconnects formed in interconnect recesses provided in a surface of the substrate; and
   forming a first metal film having a first W content and a second metal film having a second W content, which is higher than the first W content, the first metal film and the second metal film being formed on surfaces of the interconnects in a continuous manner by increasing the flow velocity of a processing solution relative to the surface of the substrate while keeping the surface of the substrate in contact with the processing solution.

2. The method according to claim 1, wherein the flow velocity of the processing solution relative to the surface of the substrate is increased by increasing the rotational speed of the substrate.

3. The method according to claim 1, wherein the flow velocity of the processing solution relative to the surface of the substrate is increased by increasing the flow velocity of the processing solution in a processing tank.

4. The method according to claim 1, wherein the first W is not more than 2 wt % and the second W content is not less than 2 wt %.

5. The method according to claim 1, wherein the first W content is a predetermined percentage of the first metal film.

6. The method according to claim 1, wherein the first metal is adjacent the substrate and the second metal film overlies the first metal film.

* * * * *